United States Patent
Tazawa et al.

(10) Patent No.: US 9,603,257 B2
(45) Date of Patent: Mar. 21, 2017

(54) PATTERN SUBSTRATE, METHOD OF PRODUCING THE SAME, INFORMATION INPUT APPARATUS, AND DISPLAY APPARATUS

(75) Inventors: Hiroshi Tazawa, Miyagi (JP); Kazuya Hayashibe, Miyagi (JP)

(73) Assignee: SONY CORPORATION, Tokyo (JP)

(*) Notice: Subject to any disclaimer, the term of this patent is extended or adjusted under 35 U.S.C. 154(b) by 190 days.

(21) Appl. No.: 13/879,778

(22) PCT Filed: Oct. 14, 2011

(86) PCT No.: PCT/JP2011/074237
§ 371 (c)(1),
(2), (4) Date: Apr. 16, 2013

(87) PCT Pub. No.: WO2012/053625
PCT Pub. Date: Apr. 26, 2012

(65) Prior Publication Data
US 2013/0220680 A1  Aug. 29, 2013

(30) Foreign Application Priority Data
Oct. 22, 2010 (JP) .................................. 2010-237944

(51) Int. Cl.
| | |
|---|---|
| *H05K 1/03* | (2006.01) |
| *H05K 3/12* | (2006.01) |
| *H01L 21/48* | (2006.01) |
| *H05K 1/02* | (2006.01) |
| *G06F 3/041* | (2006.01) |

(Continued)

(52) U.S. Cl.
CPC ............ *H05K 3/1283* (2013.01); *G06F 3/041* (2013.01); *H01L 21/4867* (2013.01); *H05K 1/02* (2013.01); *H05K 3/1258* (2013.01); *G02F 1/1333* (2013.01); *G02F 2001/133302* (2013.01); *G06F 2203/04103* (2013.01); *H01L 27/3288* (2013.01); *H01L 51/0021* (2013.01); *H05K 1/095* (2013.01)

(58) Field of Classification Search
CPC ......... H01L 21/02; H01L 21/44; H01L 21/70; H01L 21/768; H01L 23/48; H01L 23/485; G02B 1/11
USPC ......... 174/255, 70 R, 253, 254, 258; 438/57, 438/149, 626; 29/622, 846, 850; 359/601, 614; 257/10, 306, 737, 752, 257/762; 428/195.1, 209, 826
See application file for complete search history.

(56) References Cited

U.S. PATENT DOCUMENTS

| | | | |
|---|---|---|---|
| 6,180,510 B1 * | 1/2001 | Hayashi | 438/626 |
| 6,281,541 B1 * | 8/2001 | Hu | 257/306 |

(Continued)

FOREIGN PATENT DOCUMENTS

| | | |
|---|---|---|
| EP | 1 027 988 | 8/2000 |
| JP | 2006-351211 | 12/2006 |

(Continued)

*Primary Examiner* — Xiaoliang Chen
(74) *Attorney, Agent, or Firm* — Chip Law Group

(57) ABSTRACT

A pattern substrate includes a substrate having a surface on which a first area and a second area are formed, and a pattern layer formed at the first area among the first area and the second area. The pattern layer is a wiring pattern layer or a transparent electrode, the first area has a convex/concave shape where a capillary phenomenon occurs, and the convex/concave shape includes an aggregate of a plurality of structures.

14 Claims, 20 Drawing Sheets

(51) Int. Cl.
*H01L 27/32* (2006.01)
*H01L 51/00* (2006.01)
*H05K 1/09* (2006.01)
*G02F 1/1333* (2006.01)

(56) References Cited

U.S. PATENT DOCUMENTS

| | | | |
|---|---|---|---|
| 6,368,891 B1* | 4/2002 | De Haan | 438/57 |
| 6,649,249 B1* | 11/2003 | Engle et al. | 428/195.1 |
| 7,105,809 B2* | 9/2006 | Wood et al. | 250/288 |
| 7,633,045 B2* | 12/2009 | Endoh et al. | 250/216 |
| 8,309,903 B2* | 11/2012 | Endoh et al. | 250/216 |
| 8,395,315 B2* | 3/2013 | Kuroda et al. | 313/504 |
| 8,507,841 B2* | 8/2013 | Endoh et al. | 250/216 |
| 2001/0037825 A1* | 11/2001 | Nakano et al. | 136/256 |
| 2004/0129930 A1* | 7/2004 | Ohnuma et al. | 257/10 |
| 2005/0009230 A1* | 1/2005 | Hasei | B82Y 30/00 438/98 |
| 2005/0106775 A1* | 5/2005 | Hasei | H05K 1/0269 438/70 |
| 2005/0288469 A1* | 12/2005 | Higuchi et al. | 526/319 |
| 2006/0012058 A1* | 1/2006 | Hasei | B29C 41/12 264/1.32 |
| 2006/0012060 A1* | 1/2006 | Hasei | B29C 41/12 264/1.38 |
| 2006/0162770 A1* | 7/2006 | Matsui et al. | 136/263 |
| 2006/0163725 A1* | 7/2006 | Haba et al. | 257/737 |
| 2006/0166411 A1* | 7/2006 | Morisue | H01L 27/14621 438/149 |
| 2006/0214088 A1* | 9/2006 | Furusawa | H01L 31/077 250/208.2 |
| 2006/0267218 A1* | 11/2006 | Hozoji | H01L 23/24 257/782 |
| 2007/0020899 A1* | 1/2007 | Hirai | H01L 21/02126 438/584 |
| 2007/0220744 A1 | 9/2007 | Kitaoka et al. | |
| 2008/0003727 A1* | 1/2008 | Jinbo | H01L 27/1266 438/149 |
| 2008/0265149 A1* | 10/2008 | Endoh et al. | 250/237 R |
| 2008/0304155 A1* | 12/2008 | Endoh et al. | 359/558 |
| 2008/0308879 A1* | 12/2008 | Zhu | H01L 21/28518 257/384 |
| 2009/0057156 A1* | 3/2009 | Haba | C23C 18/1608 205/118 |
| 2009/0075122 A1* | 3/2009 | Nishikawa et al. | 428/826 |
| 2009/0135491 A1* | 5/2009 | Endoh et al. | 359/601 |
| 2010/0134892 A1* | 6/2010 | Endoh et al. | 359/601 |
| 2010/0206475 A1* | 8/2010 | Ueno | B41J 2/161 156/274.4 |
| 2010/0230808 A1* | 9/2010 | Joerg | 257/736 |
| 2011/0051251 A1* | 3/2011 | Endoh et al. | 359/614 |
| 2011/0073876 A1* | 3/2011 | Yoshida et al. | 257/88 |
| 2011/0100957 A1 | 5/2011 | Moran et al. | |
| 2011/0209907 A1* | 9/2011 | Lee | H05K 3/125 174/258 |
| 2011/0249338 A1* | 10/2011 | Endoh et al. | 359/601 |
| 2012/0043881 A1* | 2/2012 | Kuroda et al. | 313/504 |
| 2012/0147472 A1* | 6/2012 | Kajiya et al. | 359/601 |
| 2012/0160560 A1* | 6/2012 | Kajiya et al. | 174/70 R |

FOREIGN PATENT DOCUMENTS

| | | |
|---|---|---|
| JP | 2010-165715 | 7/2010 |
| WO | 00/12313 | 3/2000 |
| WO | 2006100790 | 9/2006 |
| WO | 2010/002519 | 1/2010 |

* cited by examiner

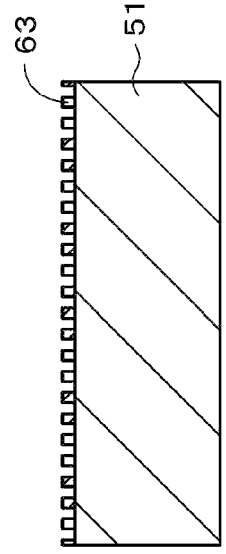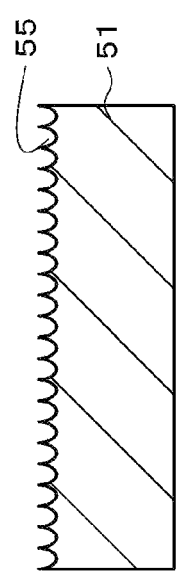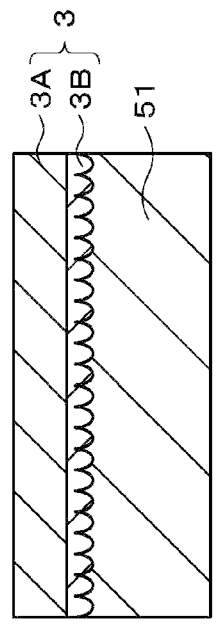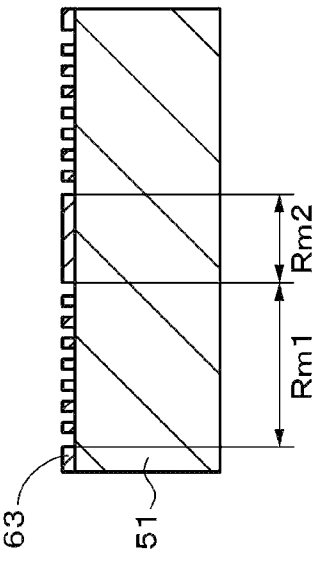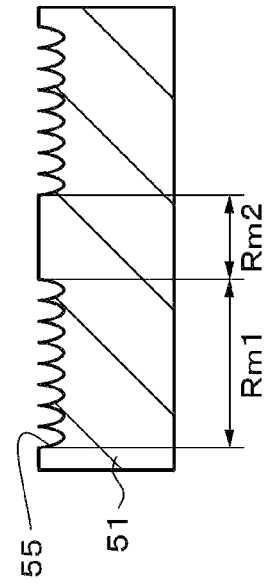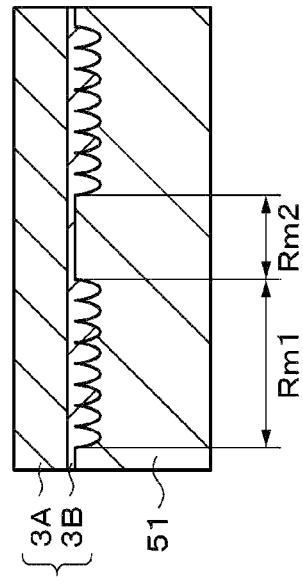
FIG.9A  FIG.9B  FIG.9C FIG.10A
FIG.10B
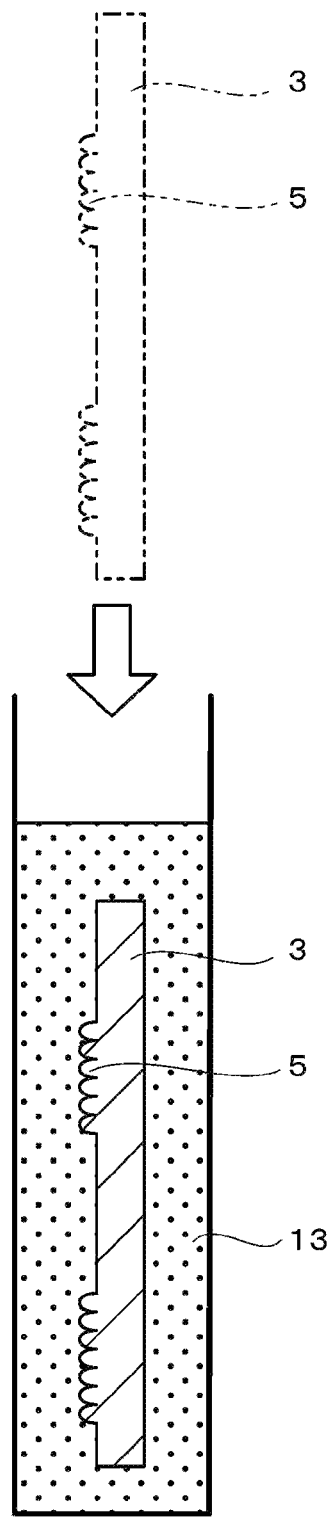
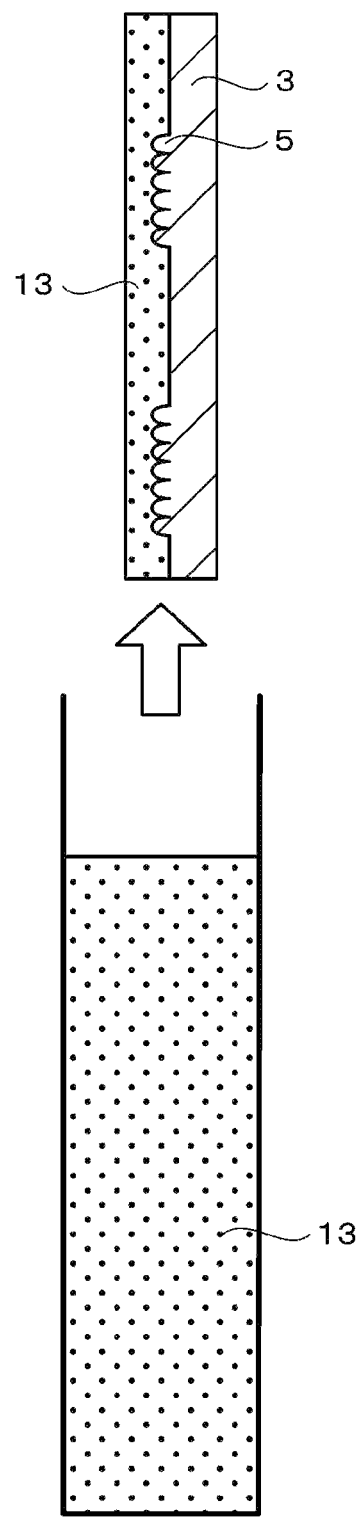

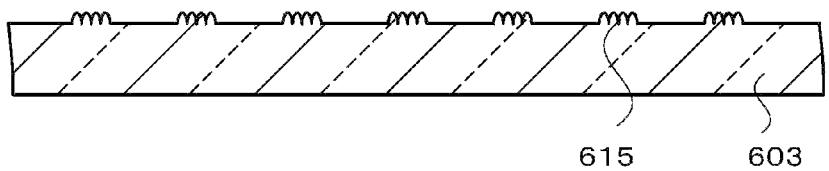
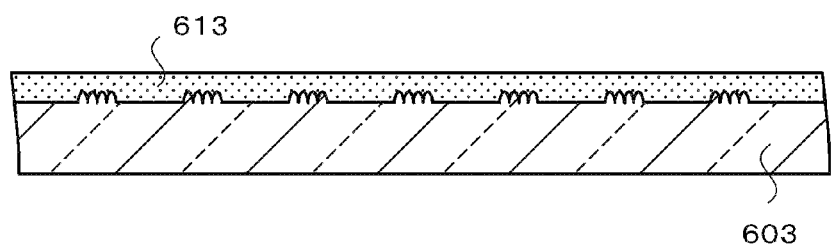
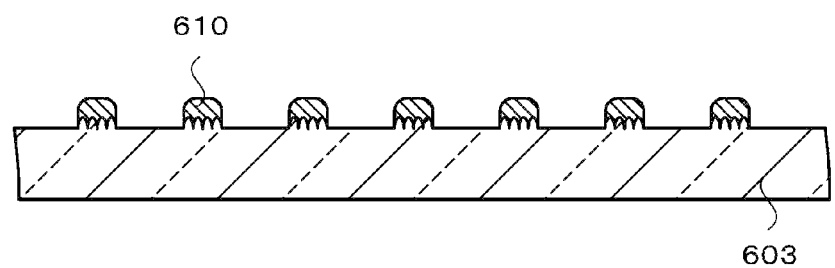
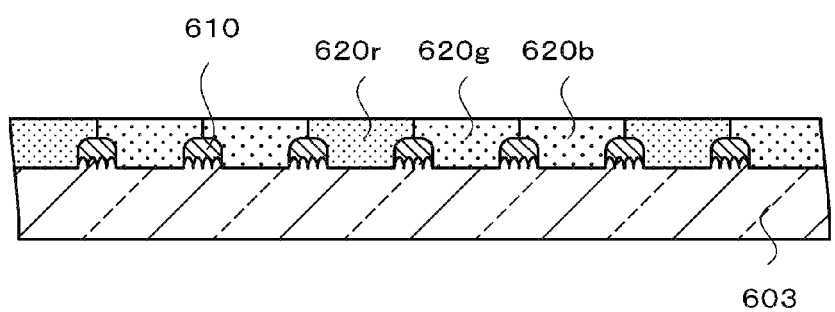
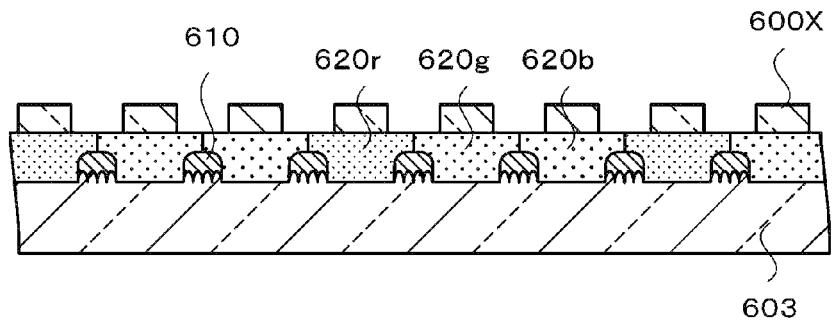

PATTERN SUBSTRATE, METHOD OF PRODUCING THE SAME, INFORMATION INPUT APPARATUS, AND DISPLAY APPARATUS

CROSS REFERENCES TO RELATED APPLICATIONS

The present application is a national stage of International Application No. PCT/JP2011/074237 filed on Oct. 14, 2011 and claims priority to Japanese Patent Application No. 2010-237944 filed on Oct. 22, 2010, the disclosure of which is incorporated herein by reference.

BACKGROUND

The present invention relates to a pattern substrate produced by a simplified patterning step, a method of producing the same, an information input apparatus and a display apparatus.

A photolithography method is known as a method of forming a wiring pattern of an electronic circuit and the like. By the photolithography method, a substrate having a fine wiring pattern can be formed.

On the other hand, there are known printable electronics for forming a wiring pattern and the like on a substrate by a printing method. For example, a desired wiring pattern can be formed on a substrate by coating (printing) a dispersion (ink) liquid provided by mixing a conductive material, a resin binder, a solvent and the like to a substrate, heating it and so on.

The printing method allows the process to be simplified as compared with the photolithography method. For example, Patent Document 1 cited below discloses a wiring substrate on which a conductor is formed on one surface of the substrate by a screen printing, and a method of producing the wiring substrate.

The formation of the wiring pattern by the screen printing method has an advantage of smaller investment than that by the photolithography method. However, the ink used is limited to a material containing a large amount of a binder. For example, when a conductive ink is used, a film thickness should be increased in order to provide desired conductivity. The screen printing is therefore not suitable for the formation of a transparent conductive film. It is desirable to provide a method of forming a pattern by easily controlling a film thickness while simplifying a step.

Patent Document

Patent Document 1: Japanese Patent Application Laid-open No. 2010-165715

SUMMARY

Problem to be Solved by the Invention

Accordingly, an object of the present invention is to provide a pattern substrate produced by a simplified patterning step as compared with a photolithography method or a printing method, a method of producing the same, an information input apparatus and a display apparatus.

Means for Solving the Problem

A first invention is a pattern substrate, including:
a substrate having a surface on which a first area and a second area are formed, and
a pattern layer formed at the first area among the first area and the second area,
the pattern layer being a wiring pattern layer or a transparent electrode,
the first area having a convex/concave shape where a capillary phenomenon occurs, and
the convex/concave shape including an aggregate of a plurality of structures.

A second invention is a method of producing a pattern substrate, including the steps of:
coating a composition for forming a pattern layer to a surface of a substrate on which a first area and a second area are formed,
continuously leaving the composition for forming a pattern layer at the first area among the first area and the second area utilizing a capillary phenomenon in the first area, and
solidifying the composition for forming a pattern layer continuously left on the first area to form a pattern layer on the first area,
the first area having a convex/concave shape, and
a capillary phenomenon occurs at the convex/concave shape.

According to the present invention, the substrate has the surface on which the first area and the second area are formed, and the pattern layer is formed at the first area. Each first area among the first area and the second area has the convex/concave shape where the capillary phenomenon occurs, and the convex/concave shape includes the aggregate of the plurality of structures. The convex/concave shape of the first area may be a fine and minute convex/concave shape called as a Moth-eye. Since the capillary phenomenon occurs only at the first area among the first area and the second area, the composition for forming a pattern layer is continuously left on the first area among the first area and the second area only by coating the composition for forming a pattern layer on the surface of the substrate. Accordingly, in order to apply the composition for forming a pattern layer spontaneously coated to the first area or the second area, it is only necessary to prepare in advance the substrate having the surface on which the first area and the second area are formed. The composition for forming a pattern layer is left on the first area, but is not left on the second area, whereby the pattern layer can be formed selectively on the first area by solidifying the composition for forming a pattern layer left on the first area.

For example, when a composition for forming a pattern layer containing a conductive material is used, the composition for forming a pattern layer is continuously left on the first area, thereby forming a desired wiring pattern or an electrode without requiring any complex step. Because the capillary phenomenon occurs only at the first area, the second area functions as an insulation area between the wiring patterns.

Preferably, the electrode has a polygonal shape of a stripe, a diamond shape and the like. Alternatively, it is preferable that the electrode constitute a mesh shape when two substrates each having an electrode are face each other, or when the substrate has the electrodes on each of face and rear surfaces.

It is preferable that a contact angle be 120 degrees or more when the composition for forming a pattern layer is dropped onto the first area to form a pattern, and a contact angle be 95 degrees or more when the composition for forming a pattern layer is dropped onto the second area. It is preferable that an arrangement pitch of structures be 150 nm or more to 1 μm or less, and an aspect ratio of the structures be 1.0 or more to 3.0 or less.

Effect of the Invention

As described above, according to the present invention, a step of forming a pattern can be simplified as compared with a photolithography method or a printing method.

Additional features and advantages are described herein, and will be apparent from the following Detailed Description and the figures.

BRIEF DESCRIPTION OF THE FIGURES

FIG. 9A to 9C A process chart for illustrating an example of a method of producing a wiring substrate according to a first embodiment of the present invention.

FIGS. 10A and 10B A process chart for illustrating an example of a method of producing a wiring substrate according to a first embodiment of the present invention.

FIG. 20A to 20E A process chart for illustrating an example of a method of producing a color filter constituting the display device according to the sixth embodiment of the present invention.

DETAILED DESCRIPTION

Hereinafter, embodiments of the present invention will be described with reference to the drawings in the following order.
1. First embodiment (application to a wiring substrate)
2. Second embodiment (application to a liquid crystal display)
3. Third embodiment (application to a display apparatus including a touch panel)
4. Fourth embodiment (application to electronic paper)
5. Fifth embodiment (application to a non-contact IC card)
6. Sixth embodiment (application to a display device)
7. Alternative embodiment 1. First Embodiment

[Structure of Pattern Substrate]

Figure 1A:
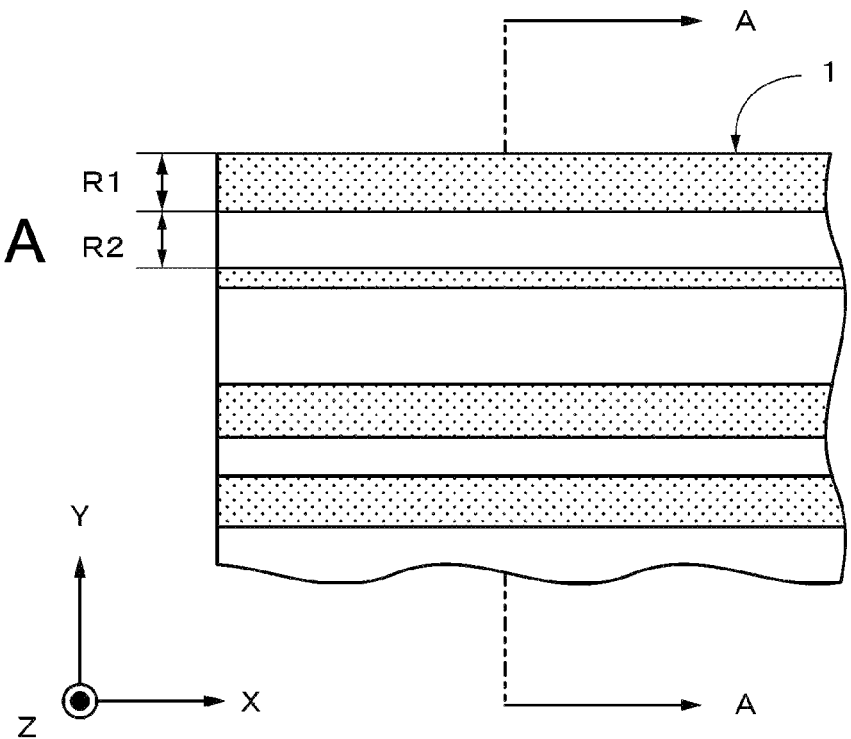
FIG. 1A A plan view showing a structural example of a wiring substrate according to a first embodiment of the present invention.
Figure 1B:
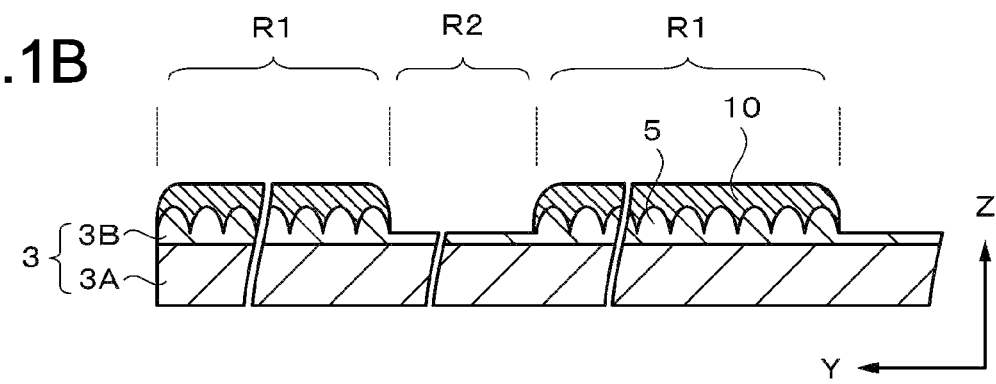
FIG. 1B A schematic sectional view along A-A showing a structural example of the wiring substrate according to the first embodiment of the present invention.

FIG. 1A is a plan view showing a structural example of a wiring substrate according to a first embodiment of the present invention. FIG. 1B is a schematic sectional view along A-A showing a structural example of the wiring substrate according to the first embodiment of the present invention. Hereinafter, two directions being orthogonal to each other within a plane of the wiring substrate are referred to as an X axis direction and a Y axis direction. A direction perpendicular to the X axis direction and the Y axis direction is referred to as a Z axis direction.

Examples of a pattern substrate include a wiring substrate, a display device and the like. Examples of the wiring substrate include a rigid substrate, a flexible substrate, a rigid flexible substrate and the like. Examples of the display device include an image display device. Examples of the image display device include a liquid crystal display, an Electro Luminescence (EL) element (e.g., an organic EL element, an inorganic EL element) and the like.

As shown in FIG. 1A and FIG. 1B, a wiring substrate 1 according to the first embodiment includes a substrate 3 having a surface on which first areas R1 and second areas R2 are formed, and pattern layers 10 formed at the first area R1 of the first area R1 and the second area R2. In the embodiment shown in FIG. 1B, the substrate 3 is configured as a lamination structure of a substrate layer 3A and a shaping layer 3B. Each first area R1 has a convex/concave shape where a capillary phenomenon occurs in a composition for forming a pattern layer to form a pattern layer 10. The convex/concave shape is configured by an aggregate of a plurality of structures 5. Although FIG. 1A shows, as an example, the pattern layer 10 continuously formed at the first area R1, e.g., the wiring pattern, has a band-like shape, the shape of the wiring pattern is not limited thereto, and can be desired shape depending on a circuit design and the like.

(Substrate)

The substrate 3 is, for example, the lamination structure of the substrate layer 3A and the shaping layer 3B. The substrate layer 3A is, for example, transparent or opaque. As a material of the substrate layer 3A, an organic material such as plastics, and an inorganic material such as glass, metal, ceramic, and paper can be used, for example. As the glass, soda lime glass, lead glass, hard glass, quartz glass, liquid crystal glass can be used, for example (see "Chemical Handbook" P.I-537, edited by the Chemical Society of Japan). As the plastic material, from the standpoint of optical properties such as transparency, refractive index and dispersibility, and various properties such as shock resistance, thermal resistance and durability, (meth) acrylic-based resin such as a copolymer of polymethyl methacrylate, methyl methacrylate with other alkyl(meth)acrylate, a vinyl monomer such as styrene; polycarbonate-based resin such as polycarbonate, diethylene glycol bis(allyl carbonate) (CR-39); thermosetting (meth)acrylic-based resin such as a single polymer or a copolymer of (brominated) bisphenol A di(meth)acrylate, a polymer and a copolymer of urethane modified monomer of (brominated) bisphenol A mono(meth)acrylate; polyester, in particular, polyethylene terephthalate, polyethylene naphtalate and unsaturated polyester, an acrylonitrile-styrene copolymer, polyvinyl chloride, polyurethane, epoxy resin, polyallylate, polyether sulfone, polyether ketone, cycloolefin polymer (trade name: ARTON, ZEONOR) and the like are preferable. It is also possible to use aramid-based resin in view of the thermal resistance.

Examples of a shape of the substrate layer 3A include a film-like, plate-like, or a block-like shape, but are not especially limited thereto, and may be a ball-like, free-curve, or bulk-like shape. When the substrate layer 3A is a plastic film, the substrate layer 3A can be provided by a cast molding that the above-mentioned resin is extruded, stretched or diluted with a solvent to form a film and dry it, for example. Herein, the term "film" is defined to encompass a sheet.

The shaping layer 3B is, for example, a layer where the plurality of structures 5 is two-dimensionally arranged. The surface of the shaping layer 3B constitutes the surface of the substrate 3. The area where the plurality of structures 5 is formed corresponds to the first area R1.

The first area R1 is an area where the capillary phenomenon occurs in the composition for forming a pattern layer to form the pattern layer 10. Each first area R1 has the convex/concave shape where the capillary phenomenon occurs in the composition for forming a pattern layer to form the pattern layer 10. The convex/concave shape includes the aggregate of the plurality of structures 5. Since the capillary phenomenon occurs in the composition for forming a pattern layer in the first area R1, the composition for forming a pattern layer coated is continuously left only on the first area R1, when the composition for forming a pattern layer is coated on the surface of the substrate 3.

On the other hand, in the second area R2, the capillary phenomenon does not occur in the composition for forming a pattern layer. Although the composition for forming a pattern layer is left on the first area R1, the composition for forming a pattern layer is not left on the second area R2. Accordingly, by solidifying the composition for forming a pattern layer left on the first area R1, the pattern layer 10 can be selectively formed at the first area R1. In the structural example shown in FIG. 1, the second area R2 is shown as an almost flat surface, but the second area R2 may have a convex/concave shape so long as the capillary phenomenon does not occur in the composition for forming a pattern layer.

When the wiring substrate 1 is, for example, a flexible substrate, it is preferable that the substrate 3 have flexibility.

Figure 2A:
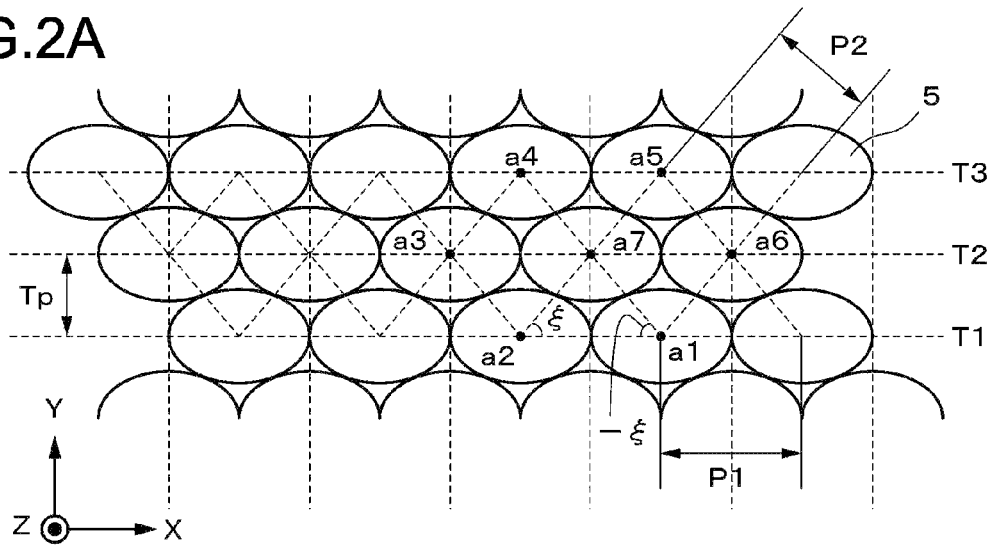
FIG. 2A A plan view of a first area.
Figure 2B:
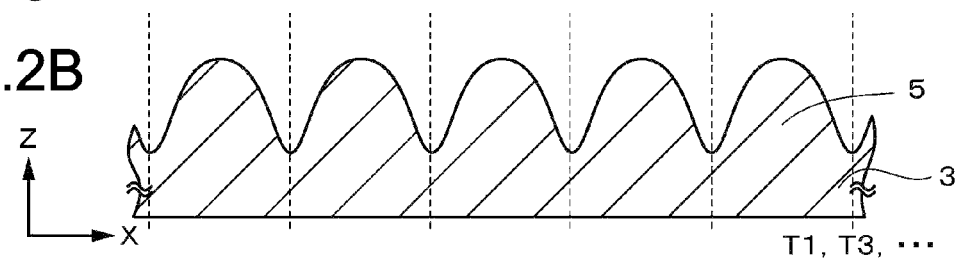
FIG. 2B A sectional view of tracks T1, T3 . . . shown in FIG. 2A.
Figure 2C:
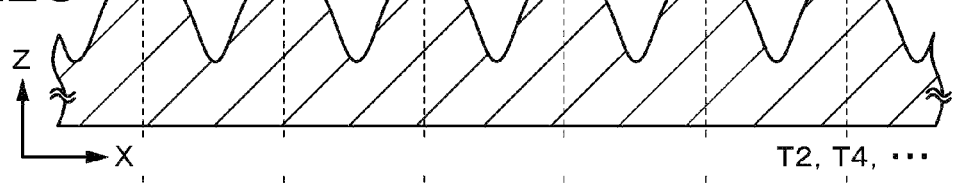
FIG. 2C A sectional view of tracks T2, T4 . . . shown in FIG. 2A.
Figure 2D:
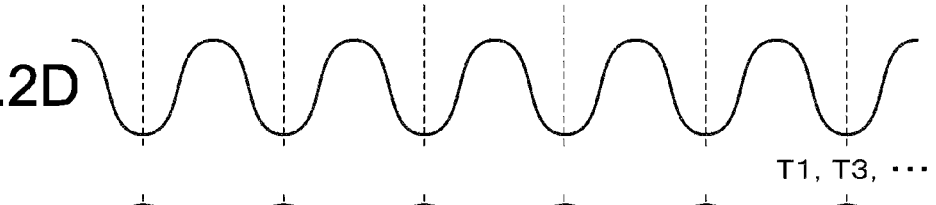
FIG. 2D An outlined line drawing showing a modulation waveform of a laser light used for forming latent images corresponding to the tracks T1, T3 . . . shown in FIG. 2A.
Figure 2E:
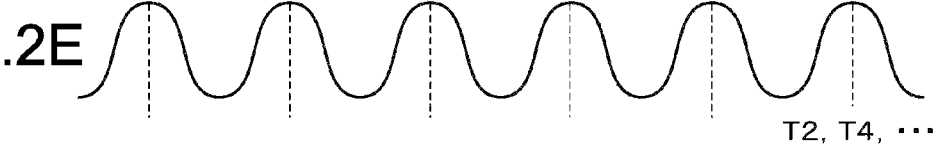
FIG. 2E An outlined line drawing showing a modulation waveform of a laser light used for forming latent images corresponding to the tracks T2, T4 . . . shown in FIG. 2A.

FIG. 2A is a plan view of a first area. FIG. 2B is a sectional view of tracks T1, T3 . . . shown in FIG. 2A. FIG. 2C is a sectional view of tracks T2, T4 . . . shown in FIG. 2A. FIG. 2D is an outlined line drawing showing a modulation waveform of a laser light used for forming latent images corresponding to the tracks T1, T3 . . . shown in FIG. 2A. FIG. 2E is an outlined line drawing showing a modulation waveform of a laser light used for forming latent images corresponding to the tracks T2, T4 . . . shown in FIG. 2A.

As described referring to FIG. 1, the convex/concave shape including the aggregate of structures 5 is formed at the first area R1 on the surface of the substrate 3. The structures 5 have an arrangement, for example, having a plurality of rows tracks T1, T2, T3 . . . (hereinafter also collectively referred to as "track T") in the first area R1. As shown in FIG. 2A, P1 represents an arrangement pitch (a distance between a1 and a2) of the structures 5 in the same track (for example, T1). P2 represents an arrangement pitch of the structures 5 between adjacent two tracks (for example, T1 and T2), i.e., an arrangement pitch of the structures 5 (for example, between a1 and a7, a2 and a7) at ±ξ direction in an extending direction of the tracks. In the present invention, the track means a series of the structures 5 in a straight or curved row. The row direction means a direction that intersects with the extending direction of the track (for example, an X axis direction) on a major surface of the substrate 5 where the aggregate of the structures 5 is formed.

In the embodiment shown in FIG. 2, the structures 5 are arranged being offset by, for example, a half pitch each other between the adjacent two tracks T. Specifically, between the adjacent two tracks T, at an intermediate position of one structure 5 arranged on one track (for example T1), another structure 5 of another track (for example T2) is arranged. As a result, as shown in FIG. 2A, the structures 5 are arranged such that a hexagonal grid pattern or a quasihexagonal grid pattern is formed where each center of the structures 5 is positioned at each point a1 to a7. According to an embodiment, the hexagonal grid pattern refers to a regular hexagonal grid pattern. The quasihexagonal grid pattern refers to a hexagonal grid pattern that is stretched and distorted in the extending direction of the track (for example, an X axis direction) which is different from the regular hexagonal grid pattern.

Figure 3A:
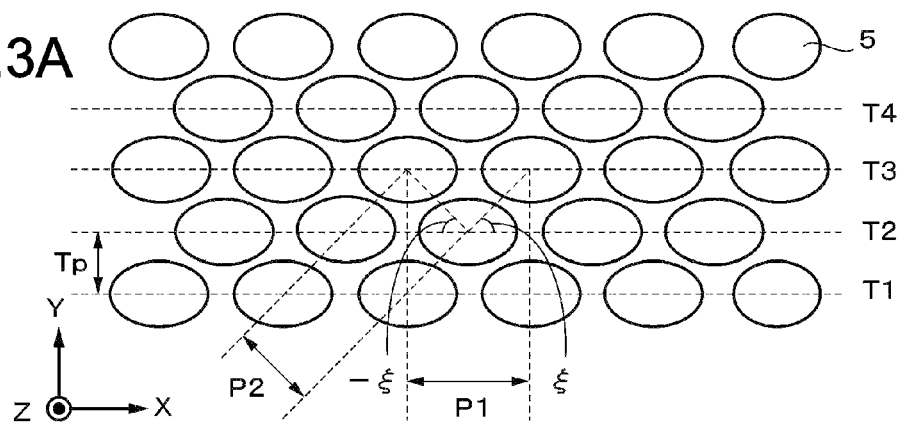
FIG. 3A A plan view showing another structural example of an arrangement of structures.
Figure 3B:
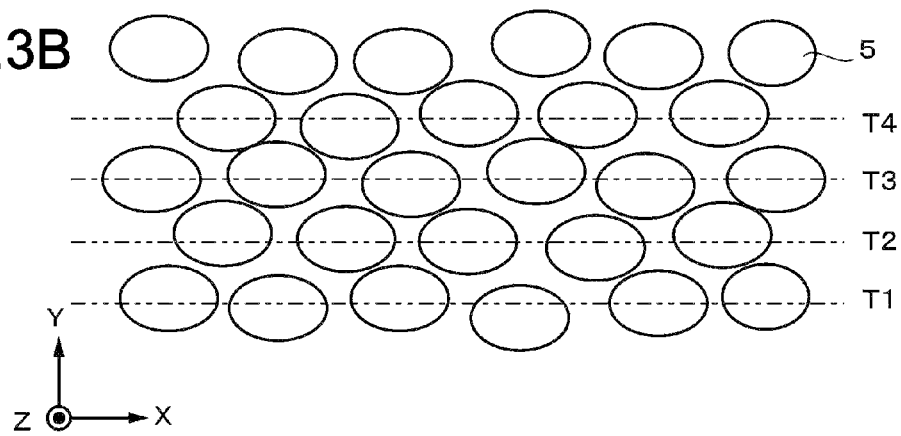
FIG. 3B A plan view showing an example where the structures formed at the first area are randomly arranged.
Figure 3C:
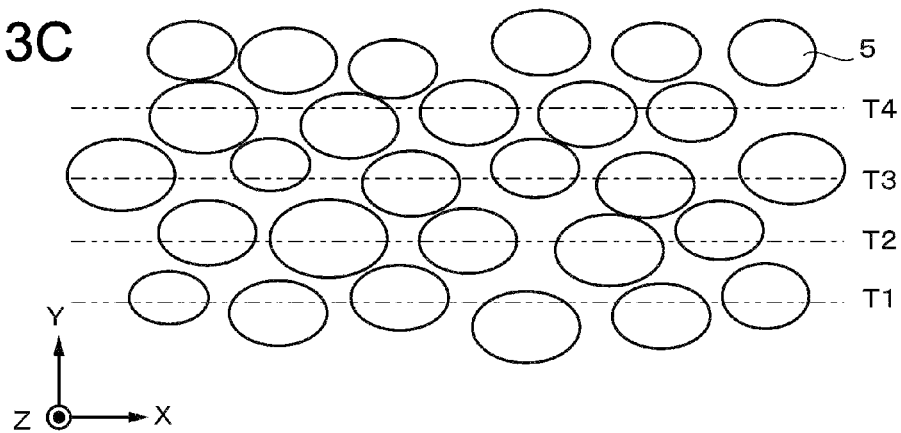
FIG. 3C A plan view showing that the structures formed at the first area have a random size and are randomly arranged.

FIG. 3A is a plan view showing another structural example of an arrangement of structures. FIG. 3B is a plan view showing an example where the structures formed at the first area are randomly arranged. FIG. 3C is a plan view showing that the structures formed at the first area have a random size and are randomly arranged.

In the embodiment shown in FIG. 3A, a number of the structures 5 formed at the first area R1 form a square grid pattern or a quasisquare grid pattern between adjacent three rows. Herein, the quasisquare grid pattern refers to a square grid pattern that is stretched and distorted in the extending direction of the track (for example, an X axis direction) which is different from the regular square grid pattern.

As shown FIG. 3B, a number of the structures 5 may be randomly arranged. Alternatively, as shown in FIG. 3C, a number of the structures 5 may have a random size and may be randomly arranged. Needless to say, a number of the structures 5 formed at the first area R1 may only have a random size.

In addition, the structures 5 may be arranged on serpentine tracks (hereinafter referred to as wobble tracks). It is preferable that a wobble of each track on the substrate 3 be synchronized. In other words, the wobble is preferably a synchronized wobble. By synchronizing the wobble, a unit grid shape of the hexagonal grid or the quasihexagonal grid can be kept. Examples of a waveform of the wobble track include a sine wave, a triangle wave and the like. The waveform of the wobble track is not limited to a cyclic waveform, and may be a non-cyclic waveform. A wobble amplitude of the wobble track is selected as, for example, about ±10 μm.

In this way, as the arrangement pattern of the structures 5, the square grid pattern, the quasisquare grid pattern, the random pattern or the wobble pattern may be used instead of the hexagonal grid pattern of the quasihexagonal grid pattern.

From the standpoint of utilizing the capillary phenomenon at the convex/concave shape and continuously leaving the composition for forming a pattern layer on the first area R1 to form the pattern layer 10, the structures 5 are two-dimensionally arranged at an arrangement pitch P, for example, of 150 nm or more to 1 μm or less by locating them adjacent or overlapping bottoms thereof. It is preferable that the aspect ratio A of the structures 5 be 1.0 or more to 3.0 or less. By defining the ranges of the arrangement pitch and the aspect ratio of the structures, the capillary phenomenon can occur in the first area R1, the composition for forming a pattern layer can be continuously left on the first area R1.

By adhering the bottoms of the adjacent structures 5 or adjusting a ratio (an ellipticity) between a short diameter and a long diameter of the bottoms of the structures to add a distortion to the structures 5, a filling rate can be improved. In addition, when the aspect ratio A of the structures 5 is 1.8 or less, the structures 5 are advantageously prevented from broken when the structures 5 are removed from a mold or the like in the step of producing the wiring substrate 1.

Herein, the arrangement pitch P means an average arrangement pitch. The aspect ratio A means an average aspect ratio obtained by dividing an average height of the structures by the average arrangement pitch. The average arrangement pitch and the average height are determined as follows:

Before the pattern layers 10 are formed or after the pattern layer 10 are formed, the wiring substrate 1 is cut such that peaks of the structures 5 are included. The sections are captured by a Transmission Electron Microscope (TEM). Next, from a TEM photo taken, the arrangement pitch of the structures 5 (the arrangement pitch P1 or P2 shown in FIG. 2A or FIG. 3A) and the height of the structures 5 (a height difference between a peak and valley in the convex/concave shape of the sections) are determined. The measurement are repeated at ten points randomly selected from the wiring substrate 1 to simply average (arithmetically average) the measured values $p_1$, $p_2$ ... $p_{10}$ and the measured values $h_1$, $h_2$ ... $h_{10}$ to determine the average arrangement pitch and the average height. In other words, the average arrangement pitch and the average height are defined by the relationship represented by the following equations (1) and (2), respectively.

$$(\text{Average arrangement pitch}) = (p_1 + p_2 + \ldots + p_{10})/10 \quad (1)$$

$$(\text{Average height}) = (h_1 + h_2 + \ldots + h_{10})/10 \quad (2)$$

where P1 is the arrangement pitch in the extending direction of the track, H1 is the height of the structures in the extending direction of the track, P2 is the arrangement pitch in the ±ξ direction to the extending direction of the track (ξ=60 degrees−δ, where δ is preferably 0 degree<δ<=11 degrees, more preferably 3 degrees<=δ<=6 degrees), and H2 is the height of the structures in the ±ξ direction to the extending direction of the track. When the structures 5 are concave, the height of the structures 5 is a depth of the structures 5 in the above-described equation (2).

The aspect ratio of the structures 5 is not always the same, and the structures 5 may have a certain height distribution. Herein, the height distribution means that the structures 5 having two or more of heights (depths) are formed on a major surface of the substrate 3. In other words, it means that the structures 5 having the height different from a base line and the structures 5 having the height different from the former height are disposed on the major surface of the substrate 3. The structures 5 having the height different from the base line are disposed cyclically or non-cyclically (randomly) on the major surface of the substrate 3, for example. Examples of a cycle direction include the extending direction and the row direction of the track.

It is preferable that a contact angle be 120 degrees or more when the composition for forming a pattern layer is dropped onto the first area R1, and a contact angle be 95 degrees or more when the composition for forming a pattern layer is dropped onto the second area R2. This is because the composition for forming a patter layer can be continuously left on the first area R1.

In a case that the pattern layer 10 is already formed, the contact angle when the composition for forming a pattern layer is dropped onto the first area R1 can be estimated by the following procedures: First, the cross section of the wiring substrate 1 is observed, and the cross section shape of the first area R1 is fitted. Next, the contact angle when the composition for forming a pattern layer is dropped onto the second area R2 is measured. Then, based on the cross section shape of the first area R1 and the contact angle when the composition for forming a pattern layer is dropped onto the second area R2, the contact angle when composition for forming a pattern layer is dropped onto the first area R1 is determined by calculation.

The contact angle herein refers to a contact angle determined by a θ/2 method. The θ/2 method is a measurement that, on the assumption that a liquid droplet is part of a circle, an angle of a straight line connecting an end point and a peak of the liquid droplet relative to a surface is determined, and the angle is doubled to be the contact angle θ.

Figure 4:
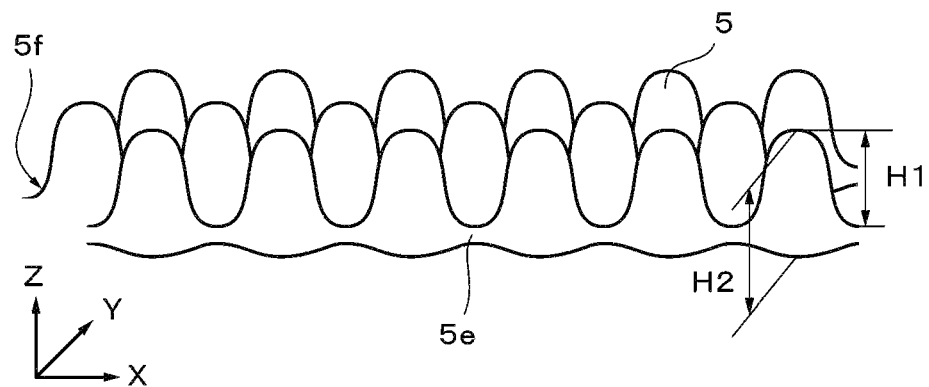
FIG. 4 A perspective view showing a structural example of an aggregate of structures.

FIG. 4 is a perspective view showing a structural example of the aggregate of the structures. The embodiment shown in FIG. 4 is the aggregate of the structures where slopes of centers of cone shapes are steeper than bottoms and peaks thereof.

Specific examples of the structures 5 include a cone, a column, a needle, a hemisphere, a semioval and a polygonal, but are not limited thereto, and may be other shapes. For example, the cone may have an acuate apex, a flat apex, or a curved, i.e., convex or concave, surface, but may not be limited thereto. Alternatively, the apex may be cut-off, or a minute hole or holes may be formed on the surface of the structures 5, e.g., on the apex. A conical surface of the cone may be curved concave or convex shape. Although in the embodiment shown in FIG. 4, each structure 5 has the same size and/or shape, the shape of the structure 5 is not limited thereto, and the structures 5 may be formed to have two or more sizes and/or shapes. In a case that a roll master is produced using a roll master exposure apparatus as described later, it is preferable that the structures 5 have the cone shape having the curved convex surface on the apex, or having the flat apex, and a longitudinal direction of the cone forming the bottom surface coincide with an extending direction of a track.

Hems 5f may be formed around peripherals of the structures 5, because the structures 5 can be easily peeled from a mold or the like in the production step of the wiring substrate 1. Herein, the hems 5f means protrusions disposed at bottom peripherals of the structures 5. As shown in FIG. 4, protrusions 5e may be disposed around a part or all of the structures 5.

The shaping layer 3B may be formed by light or thermal transferring the concave/convex shape of the master onto the transferring material. When the light transfer, e.g., UV (ultraviolet) transfer is performed, the transferring material can comprises a ultraviolet ray curing material, an initiator, if needed, a filler, a functional additive and the like, for example.

The ultraviolet ray curing material comprises a monofunctional monomer, a difunctional monomer, a polyfunctional monomer and the like, for example. Specifically, the materials shown below is used alone, or mixed in combination.

Examples of the monofunctional monomer include carboxylic acids (acrylic acids), hydroxyls (2-hydroxyethyl acrylate, 2-hydroxypropyl acrylate, 4-hydroxybutyl acrylate), alkyl, alycyclic compounds (isobutyl acrylate, t-butyl acrylate, isooctyl acrylate, lauryl acrylate, stearyl acrylate, isobonyl acrylate, cyclohexyl acrylate), other functional monomers (2-methoxyethyl acrylate, methoxyethylene glycol acrylate, 2-ethoxyethyl acrylate, tetrahydrofurfuryl acrylate, benzyl acrylate, ethyl carbitol acrylate, phenoxyethyl acrylate, N,N-dimethylaminoethyl acrylate, N,N-dimethylaminopropyl acrylamide, N,N-dimethyl acrylamide, aclyroyl morpholine, N-isopropyl acrylamide, N,N-diethyl acrylamide, N-vinyl pyrrolidone, 2-(perfluorooctyl)ethyl acrylate, 3-perfluorohexyl-2-hydroxypropyl acrylate, 3-perfluorooctyl-2-hydroxypropyl acrylate, 2-(perfluorodecyl) ethyl acrylate, 2-(perfluoro-3-methylbutyl)ethyl acrylate, 2,4,6-tribromophenol acrylate, 2,4,6-tribromophenol methacrylate, 2-(2,4,6-tribromophenoxy)ethyl acrylate, 2-ethylhexyl acrylate and the like.

Examples of the difunctional monomer include tri(propyleneglycol)diacrylate, trimethylolpropane diallylether, urethane acrylate and the like.

Examples of the polyfunctional monomer include trimethylolpropane triacrylate, dipentaerythritol penta and hexa acrylate, ditrimethylol propane tetraacrylate and the like.

Examples of the initiators include 2,2-dimethoxy-1,2-diphenylethane-1-on, 1-hydroxy-cyclohexylphenylketone, 2-hydroxy-2-methyl-1-phenylpropane-1-on and the like.

For example, as fillers, any of inorganic particles and organic particles can be used. Examples of the inorganic particles include metal oxide particles such as $SiO_2$, $TiO_2$, $ZrO_2$, $SnO2$, and $Al_2O_3$.

Examples of the functional additives include a leveling agent, a surface modifier, a deformer and the like.

When the thermal transfer is performed, the transfer material can be a thermoplastic resin that is soften by heating, cooled and solidified after molding. Examples of the thermoplastic resin include polycarbonate (PC), polypropylene (PP), polyethylene (PE), polyethylene terephthalate (PET), polyethylene naphthalate (PEN) and the like.

In the above-mentioned embodiment, it is described that the substrate 3 is configured as the lamination structure of the substrate layer 3A and the shaping layer 3B. However, it is not limited thereto. For example, the substrate 3 may be the substrate having the convex/concave shape formed integrally on the first areas R1. The substrate 3 can be formed by non-limiting methods such as injection molding, extrusion molding and cast molding.

When the surface of the substrate 3 contains fluorine or silicone, the second areas R2 are likely to have high liquid repellency to leave the composition for forming a pattern layer in the first areas but not to leave the composition for forming a pattern layer in the second areas.

In order to contain fluorine on the surface of the substrate 3, the shaping layer 3B may specifically contain a compound having a fluoro alkyl group. For example, a liquid repellent film containing the compound having a fluoro alkyl group may be formed on the surface of the shaping layer 3B. Examples of the compound having a fluoro alkyl group include perfluoropolyether and (meta)acrylate having a fluoro alkyl group. Examples of the (meta)acrylate having a fluoro alkyl group include perfluorooctylethyl acrylate, are not limited thereto, and may be used in combination of two or more types. The liquid repellent film may be formed selectively at the second areas R2.

When the thermal transfer is performed, the substrate 3 may contain a fluorine-containing material, for example. As the material, polytetrafluoroethylene (PTFE), a tetrafluoroethylene-perfluoroalkylvinyl ether copolymer (PFA), a tetrafluoroethylene-hexafluoropropylene copolymer (FEP), a tetrafluoroethylene-ethylene copolymer (ETFE), polyvinylidene fluoride (PVDF), polychloro trifluoroethylene (PCTFE) and the like can be used, for example.

In order to contain fluorine on the surface of the substrate 3, a liquid repellent film containing silicone resin may be formed on the surface of the shaping layer 3B. As the silicone resin, organopolysiloxanes having a basic skeleton of a siloxane bond including Si and O and a side chain of an organic group can be used.

When the thermal transfer is performed, a silicone polymer or a silicone oil may be dispersed onto the substrate 3, for example.

(Pattern Layer)

The pattern layer 10 is formed at the first area R1 of the first area R1 and the second area R2. As described later, the pattern layer 10 is formed by coating the composition for forming a pattern layer on the surface of the substrate 3, continuously leaving the composition for forming a pattern layer at the first area among the first area and the second area, and solidifying the composition for forming a pattern layer left on the first area. Preferably, the composition for forming a pattern layer is not left on the second area R2. But, the composition for forming a pattern layer may be left discontinuously on the second area R2 so long as the second area R2 functions as the insulation area, when the composition for forming a pattern layer contains a conductive material.

The pattern layer 10 formed at the first area forms, for example, an electrode wiring pattern, a transparent electrode pattern and the like. Specifically, it configures a transparent electrode, an electrode wiring, a mesh type transparent electrode and a wire drawing electrode of a device such as a touch panel.

The composition for forming a pattern layer is so-called conductive ink, and may contain a conductive material, if needed, a binder and a solvent. Further, the composition for forming a pattern layer may contain an additive such as a dispersion aid, a curing accelerator, a leveling agent, an antisettling agent, a covering material of the conductive material, a coupling agent, a deformer and the like. When the composition for forming a pattern layer contains the conductive material, the pattern layer 10 functions as a wiring pattern (a conductive pattern part) or an electrode. When the composition for forming a pattern layer contains a binder such as resin, it is preferable that the conductive material be fixed so as to contact the conductive materials each other.

The conductive material contained in the composition for forming a pattern layer can be selected depending on the application of the wiring substrate 1, as appropriate. As the conductive material, an inorganic or organic conductive material can be used. Examples of the inorganic conductive material include metal nano particles, a transparent oxide semiconductor, or carbon nanotube. Examples of the metal material include at least one metal fine particle selected from the group consisting of gold, silver, copper, palladium, platinum, nickel, aluminum, chromium, niobium, rhodium, ruthenium, iridium and osmium, or an alloy thereof. Gold, silver and copper are preferable, because they have high electrical conductivity. These metals may be used alone or in combination of two or more. In particular, when silver fine particles are used, it is preferable that two or more metal fine particles be used in order to decrease the effect of electromigration.

The metal nano particles may be metal compound fine particles. The metal nano particles may have non-limiting shapes, but preferably have spherical or scale-like shapes. From the standpoint of the conductivity and dispersibility, the metal nano particles have an average particle diameter of preferably 1 nm or more to 100 nm or less, more preferably 2 nm or more to 40 nm or less. When the average particle diameter is 2 nm or more, synthesis becomes easier. When the average particle diameter is 40 nm or less, the metal nano particles can be sintered at a temperature lower than a melting point of a metal constituting the metal nano particles, once they are sintered. As the metal compound fine particles, metal oxide fine particles such as silver oxide, copper oxide, palladium oxide and platinum oxide are preferable. Among them, silver oxide and copper oxide fine particles are preferable.

When the pattern layer 10 is the transparent conductive layer, the transparent conductive layer is an inorganic transparent conductive layer mainly containing a transparent oxide semiconductor, for example. As the transparent oxide semiconductor, a binary compound such as $SnO_2$, $InO_2$, ZnO and CdO, a ternary compound including at least one element of Sn, In, Zn and Cd that are constitute elements of the binary compound, or a multicomponent (composite) oxide can be used. Specific examples of the transparent oxide semiconductor include indium tin oxide (ITO), zinc oxide (ZnO), aluminum doped zinc oxide ($AZO(Al_2O_3$, ZnO)), SZO, fluorine doped tin oxide (FTC), tin oxide ($SnO_2$), gallium doped zinc oxide (GZO), indium zinc oxide ($IZO(In_2O_3,ZnO)$) and the like. In particular, from the standpoint of high reliability, low resistivity and the like, indium tin oxide (ITO) is preferable. ITO nano particles can be used as the conductive material. The transparent conductive layer is, for example, an organic transparent conductive layer containing a conductive polymer as a main component. As the conductive polymer, a conductive polymer material such as polythiophene-based, polyanyline-based and polypyrrol-based materials can be used. It is preferable that the polythiophene-based conductive polymer material be used. As the polythiophene-based conductive polymer material, it is preferable that a PEDOT/PSS-based material provided by doping polystyrene sulfonic acid (PSS) to polyethylenedioxythiophene (PEDOT) be used.

As the binder, a resin material can be used. As the resin material, a thermosetting resin, a thermoplastic resin or an energy line irradiation type resin can be used. Specific examples include epoxy resin, phenol resin, polyimide resin, polyurethane resin, melamine rein, urea resin, polyvinylidene fluoride (PVDF), alkali resin and the like. Two or more thereof can be used in combination. As the energy line, electron beam, ultraviolet ray, visible ray, gamma ray, electron ray and the like can be used, for example. From the standpoint of productive facilities, ultraviolet ray is preferable.

The solvent is not especially limited so long as the conductive material and the binder can be dispersed. For example, as the solvent, a volatile solvent can be used. Examples include alcohols such as methanol, ethanol, propanol and butanol; hydrocarbond compounds such as n-heptane, n-octane, decane, dodecane, tetradecane, toluene, xylene, cymene, Durene, inden, dipentene, tetrahydronaphthalene, decahydronaphthalene and cyclohexylbenzene; ether compounds such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxy ethane, bis(2-methoxyethyl)ether, and p-dioxane; and polar compounds such as propylene carbonate, γ-butyrolactone, N-methyl-2-pyrollidone, dimethylformamide, dimethylsulfoxide and cyclohexanone. Among them, from the standpoint of dispersibility of the conductive material and stability of the dispersion, alcohols, hydrocarbon compounds and ether compounds are preferable. In addition, water may be used as the solvent.

It is preferable that a surface resistance of the pattern layer 10 formed as the wiring pattern be 1000 Ω/square or less. When the surface resistance is 1000 Ω/square or less, the pattern layer 10 is suitable for a wiring or an electrode.

(Configuration of Roll Master)

Figure 5A:
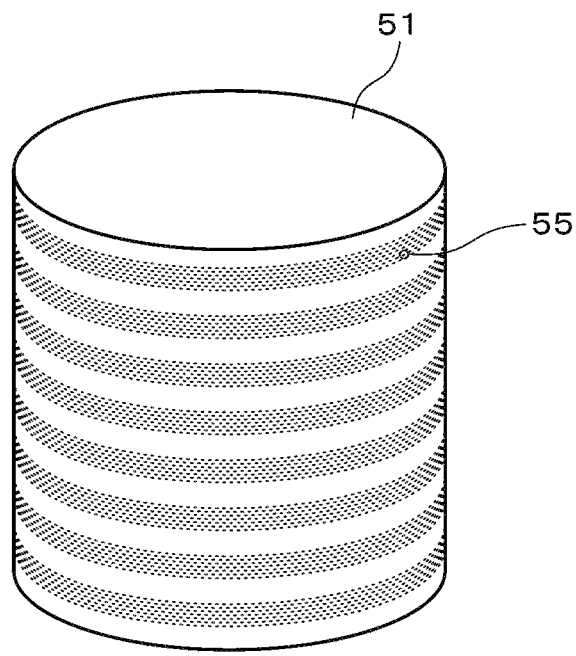
FIG. 5A A perspective view showing a structural example of a master for transferring a concave/convex shape into the first area.
Figure 5B:
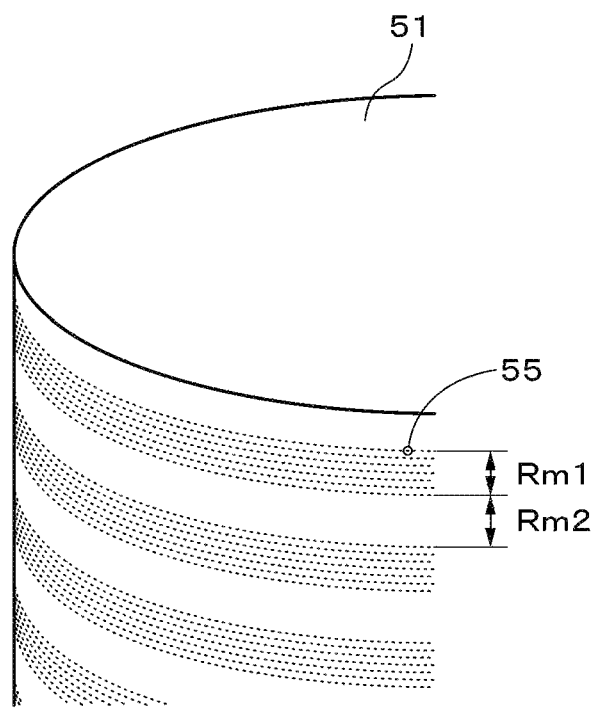
FIG. 5B A perspective view showing by enlarging a part of the master shown in FIG. 5A.

FIG. 5A is a perspective view showing a structural example of a master for transferring a concave/convex shape into the first areas. FIG. 5B is a perspective view showing by enlarging a part of the master shown in FIG. 5A. As the master for transferring the concave/convex shape into the first areas, a roll master can be used, for example. The roll master 51 shown in FIGS. 5A and 5B has a columnar cylindrical or hollow cylindrical shape, for example. On a surface of the columnar cylinder or the hollow cylinder, a number of first areas Rm1 and second areas Rm2 are set. FIGS. 5A and 5B show a case that each first area Rm1 and each second area Rm2 are formed in a ring shape in a circumferential direction. However, the shapes of the first area Rm1 and the second area Rm2 are not limited to this embodiment, and are selected depending on the desired wiring pattern, i.e., the shape of the pattern layer 10 formed at the first area as appropriate. Non-limiting examples of a material used in the roll mater 51 include metal or glass.

Figure 6A:
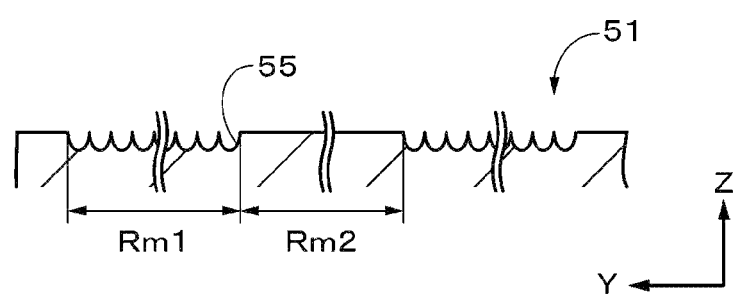
FIG. 6A A sectional view showing by enlarging a part of a roll master shown in FIG. 5A.
Figure 6B:
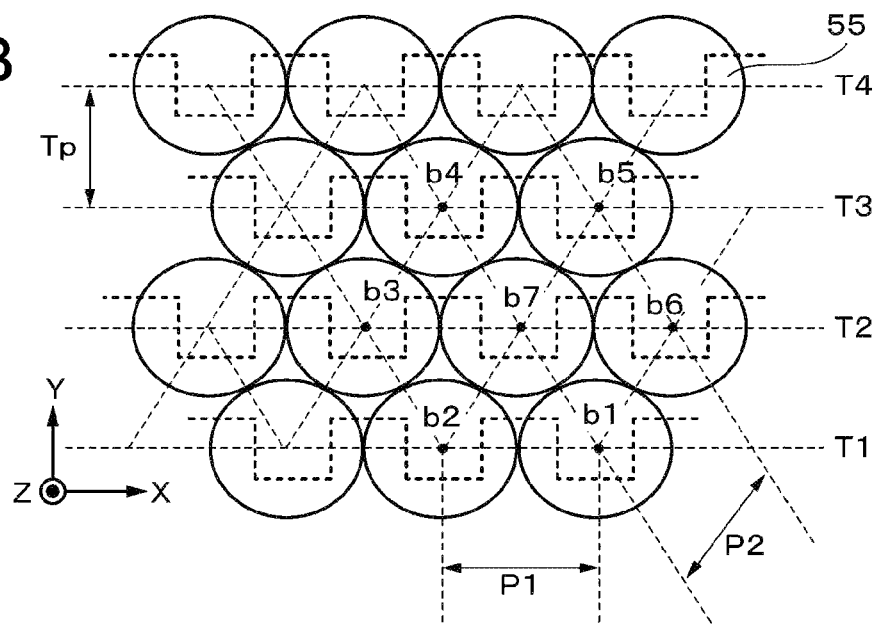
FIG. 6B A plan view showing by enlarging a part of the first area shown in FIG. 6A.

FIG. 6A is a sectional view showing by enlarging a part of the roll master shown in FIG. 5A. FIG. 6B is a plan view showing by enlarging a part of the first area shown in FIG. 6A. A number of concave structures 55 are disposed in the first areas Rm1 of the roll master 51 in a predetermined pitch, and the second areas Rm2 are almost planar without forming the concave structures 55, for example. A number of structures 55 in the first areas Rm1 are arranged such that a hexagonal grid pattern or a quasihexagonal grid pattern is formed where each center of the structures 55 is positioned at each point b1 to b7 between three rows of tracks (T1 to t3) adjacent. In such a hexagonal grid pattern or a quasi-hexagonal grid pattern, a roll master exposure apparatus as described later is used to link spatially a two-dimensional pattern, thereby producing a polarity reversion formatter signal and a signal by synchronizing a rotation controller of a recording apparatus per track. In this manner, recording can be performed by patterning at an adequate feed pitch with a constant angular velocity (CAV). By setting a frequency of the polarity reversion formatter signal and the rotation number of the roll appropriately, it is possible to form grid patterns having a uniform spatial frequency in the desired recording area.

(Configuration of Exposure Apparatus)

Figure 7:
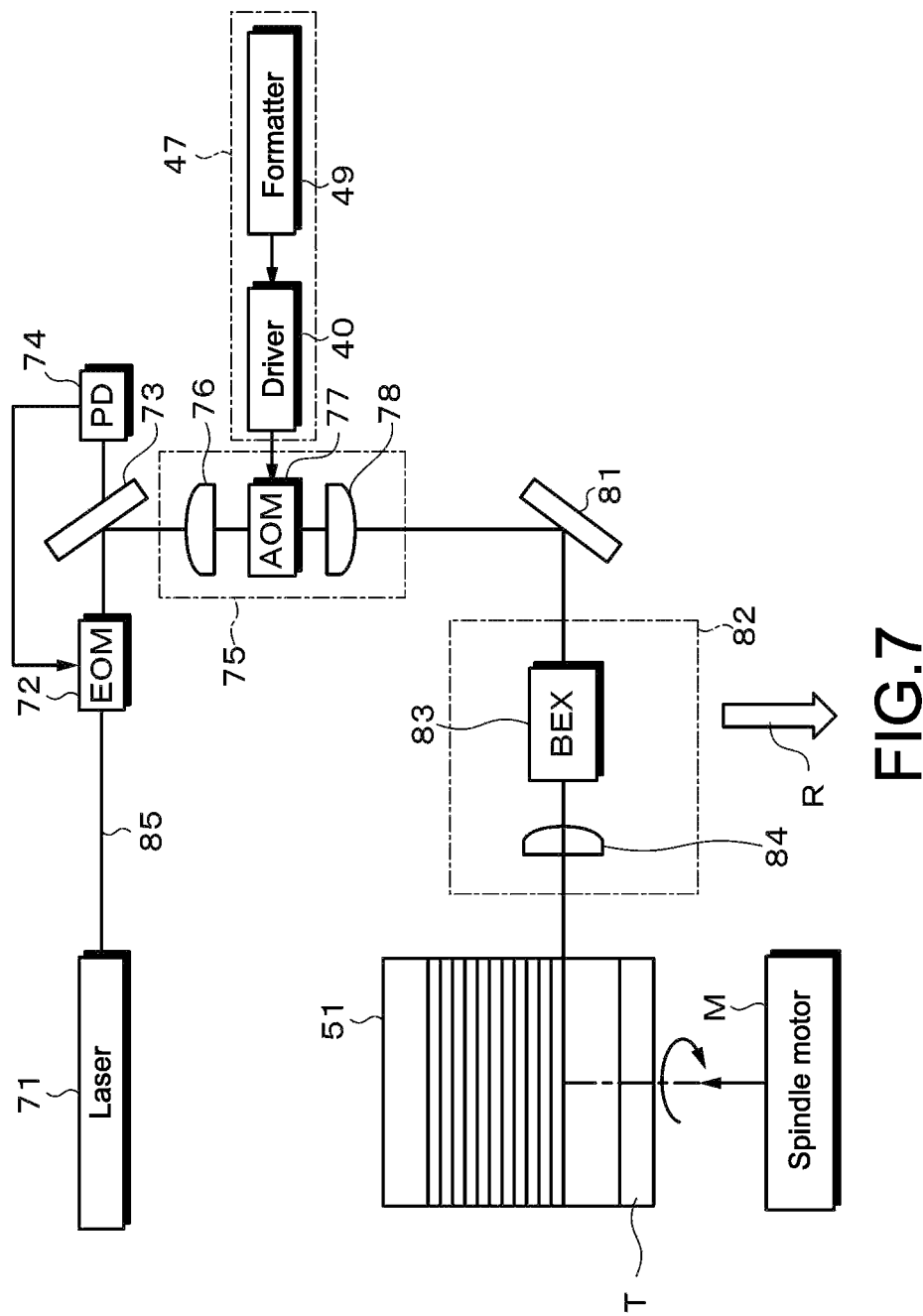
FIG. 7 A schematic view showing a structural example of a roll master exposure apparatus.

FIG. 7 is a schematic view showing a structural example of a roll master exposure apparatus. Referring to FIG. 7, a configuration of the roll master exposure apparatus will be described. The roll master exposure apparatus can be configured based on an optical disk recording apparatus, for example.

A laser light source 71 is for exposing a resist deposited on the surface of the roll master 51 that is the recording medium, and oscillates a laser light 85 for recording having a wavelength λ of 266 nm, for example. The laser light 85 emitted from the laser light source 71 goes straight ahead as a parallel beam and is incident on an Electro Optical Modulator (EOM) 72. The laser light 85 transmitted through the electro optical modulator 72 is reflected on a mirror 73 and is guided by a modulation optical system 75.

The mirror 73 is configured by a polarized beam splitter, and has a function to reflect one polarization component and transmit the other polarization component. The polarization component transmitted through the mirror 73 is light-received by a photodiode 74. Based on a light-received signal, the electro optical modulator 72 is controlled to perform phase modulation of the laser light 85.

In the modulation optical system 75, the laser light 85 is light-collected to an Acoust-Optic Modulator (AOM) 77 made of glass ($SiO_2$) and the like by a light-collecting lens 76. After the laser light 85 is intensity-modulated by the acoust-optic modulator 77 and diffused, the laser light 85 is made into a parallel beam. The laser light 85 emitted from the modulation optical system 75 is reflected by the mirror 81, and is guided horizontally and in parallel on a moving optical table 82.

The moving optical table 82 includes a beam expander 83 and an object lens 84. The laser light 85 guided to the moving optical table 82 is shaped into a desired beam shape by the beam expander 83, and then irradiated to a resist layer on the roll master 51 via the objective lens 84. The roll master 51 is mounted on a turn table T connected to a spindle motor M. By rotating the roll master 51, moving the laser light 85 to a height direction of the roll master 51 and irradiating the resist layer with the laser light 85 intermittently, the resist layer is exposed. The latent images formed become an approximate oval shape having a long axis in a circumferential direction. The laser light 85 is moved by moving the moving optical table 82 in an arrow R direction.

The exposure apparatus includes a control mechanism 47 for forming latent images on the resist layer corresponding to a hexagonal grid or quasihexagonal grid two-dimensional pattern as shown in FIG. 2A. The control mechanism 47 includes a formatter 49 and a driver 40. The formatter 49 includes a polarity inverting part. The polarity inverting part controls an irradiation timing of the laser light 85 to the resist layer. The driver 40 receives an output from the polarity inverting part, and controls the acoust-optic modulator 77.

In the roll master exposure apparatus, a signal is produced by synchronizing the polarity reversion formatter signal and a rotation controller of the recording apparatus per track so that the two-dimensional pattern is spatially linked. The signal thus-produced is intensity-modulated by the acoust-optic modulator 77. By patterning with an adequate rotation number, an adequate modulation frequency and an adequate feed pitch at a constant angle velocity (CAV), the hexagonal grid or quasihexagonal grid pattern can be recorded. For example, in order to provide a circumferential frequency of 315 nm, and an about 60 degrees (about −60 degrees) frequency to the circumferential direction of 300 nm, the feed pitch may be 251 nm (Pythagorean theorem). The frequency of the polarity reversion formatter signal is changed by the rotation number (for example, 1800 rpm, 900 rpm, 450 rpm and 225 rpm). For example, the frequency of the polarity reversion formatter signal corresponding to the rotation number of the roll of 1800 rpm, 900 rpm, 450 rpm or 225 rpm is 37.70 MHz, 18.85 MHz, 9.34 MHz or 4.71 MHz, respectively. The quasihexagonal grid having a uniform spatial frequency in the desired recording area (a circumferential frequency of 315 nm, and an about 60 degrees (about −60 degrees) frequency to the circumferential direction of 300 nm) can be provided by magnifying a beam diameter of a far infrared laser light by 5 times with a beam expander (BEX) 83 disposed on the moving optical table 82, irradiating it to the resist layer on the roll master 51 via the objective lens 84 having a numerical aperture (NA) of 0.9, and forming fine latent images.

[Method of Producing Pattern Substrate]

Referring to FIGS. 8 to 11, each step of a method of producing the wiring substrate 1 according to the first embodiment of the present invention will be described. In the production method, a part or all of the processes after the transfer step is preferably performed by a roll-to-roll process in view of productivity.

(Resist Layer Forming Step)

Figure 8A:
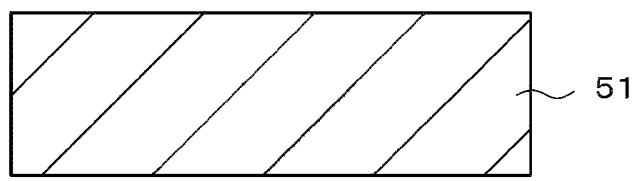
FIG. 8A to 8C A process chart for illustrating an example of a method of producing a wiring substrate according to a first embodiment of the present invention.
Figure 8B:
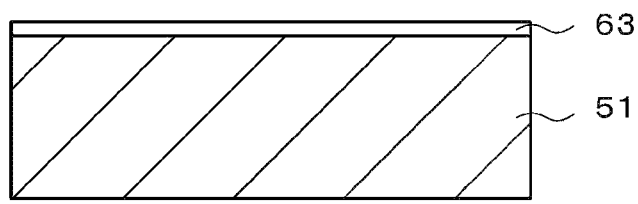

First, as shown in FIG. 8A, a columnar cylindrical or hollow cylindrical roll master 51 is prepared. The roll master 51 is made of glass, for example. Next, as shown in FIG. 8B, a resist layer 63 is formed on a surface of the roll master 51.

As a material of the resist layer 63, any of an organic based resist and an inorganic based resist may be used, for example. The organic based resist can include a novolac type resist and a chemically amplified type resist. The inorganic based resist can include one, two or more of metal compound(s).

(Exposure Step)

Figure 8C:
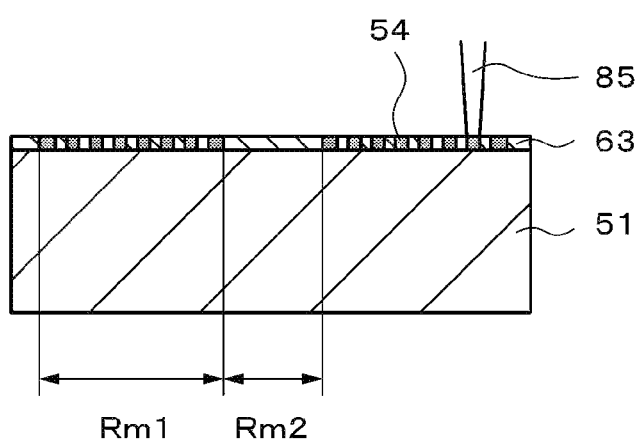

As shown in FIG. 8C, using the above-described roll master exposure apparatus, the roll master 51 is rotated and the resist layer 63 is irradiated with the laser light (exposure beam) 85. At this moment, while the laser light 85 is moved in a height direction of the roll master 51 (a direction parallel to a center axis of the columnar cylindrical or hollow cylindrical roll master 51), the resist layer 63 is irradiated with the laser light 85. In this case, the latent images are formed to configure exposed areas only on the first areas R1 corresponding to the wiring pattern. In contrast, the second areas R2 corresponding to an insulation area between the wiring patterns are not exposed to configure non-exposed areas. The latent images 54 corresponding to a trajectory of the laser light 85 are formed in a pitch smaller than a wavelength of a visible light, for example.

The latent images 54 are disposed to form a plurality of lines of tracks on the surface of the roll master, and the hexagonal grid pattern or the quasihexagonal grid pattern is formed. For example, the latent images 54 each has an oval shape with a long axis in an extending direction of the track.

(Development Step)

Next, while the roll master 51 is rotated, a developer is dropped onto the resist layer 63. As shown in FIG. 9A, the resist layer 63 is developed. When the resist layer 63 is formed with a positive resist as shown, the exposed areas exposed with the laser light 85 are dissolved by the developer faster than the non-exposed areas. As a result, patterns corresponding to the latent images (the exposed areas) 54 are formed on the resist layer 63. In this way, apertures each having the hexagonal grid pattern or the quasihexagonal grid pattern are formed on the resist layer 63 in the first areas Rm1. On the other hand, no apertures are formed on the resist layer 63 in the second areas Rm2, and the second areas Rm remain fully covered with the resist layer 63. In other words, a mask having aperture patterns only in the first areas R1 is formed on the surface of the roll master.

(Etching Step)

Next, a pattern of the resist layer 63 formed on the roll master 51 is used as a mask (a resist pattern) to etch the surface of the roll master 51. In this way, the etching proceeds in the first areas Rm1 on the surface of the roll master via the apertures. As shown in FIG. 9B, structures (concave parts) 55 each having an oval conical shape, an oval cone shape etc. with a long axis in the extending direction of the track are formed. On the other hand, as the second areas Rm2 on the surface of the roll master are totally covered with the resist layer 63, no etching is carried out and the surface of the roll master is kept flat. Examples of the etching method include a wet etching method and a dry etching method.

Thus, the roll master 51 to be intended is provided.

(Transfer Step)

Next, as shown in FIG. 9C, the structures (concave parts) 55 formed at the first areas Rm1 of the roll master 51 are transferred by an optical transfer or a thermal transfer. When the optical transfer, e.g., a UV (ultraviolet) transfer, is performed, a transfer material 65 is coated on the substrate layer 3A including a resin film or the like and the transfer material 65 coated is irradiated with a ultraviolet ray or the like in intimately contact with the roll master 51. After the transfer material 65 is cured to form the shaping layer 3B, the substrate 3 integrally including the substrate layer 3A and the shaping layer 3B is peeled.

In order to further improve a surface energy, coating properties, sliding properties, flatness of the plastic surface, a primer layer may be formed on the surface of the substrate layer 3A, or the surface of the substrate layer 3A may be treated by UV irradiation, corona treatment and the like, as needed. The primer layer may include an organoalkoxy metal compound, polyester, acrylic-modified polyester, polyurethane and the like.

(Coating Step)

Next, the surface of the substrate 3 on which the first areas R1 and the second areas R2 are formed is coated with a composition for forming a pattern layer 13. As shown in FIG. 10A, the substrate 3 is immersed into a tank containing the composition for forming a pattern layer 13. When the substrate 3 is drawn up, the composition for forming a pattern layer 13 covers the surface of the substrate 3, whereby the surface of the substrate 3 on which the first areas R1 and the second areas R2 are formed can be coated with the composition for forming a pattern layer 13, as shown in FIG. 10B. In the embodiment shown in FIGS. 10A and 10B, a dip coating is described as an example. A method of coating with the composition for forming a pattern layer 13 is not limited to the dip coating, and a spin coating, a roll coating, a gravure coating, a microgravure coating, a die coating and the like can be applied.

(Step to Leave Composition for Forming Pattern)

Figure 11A:
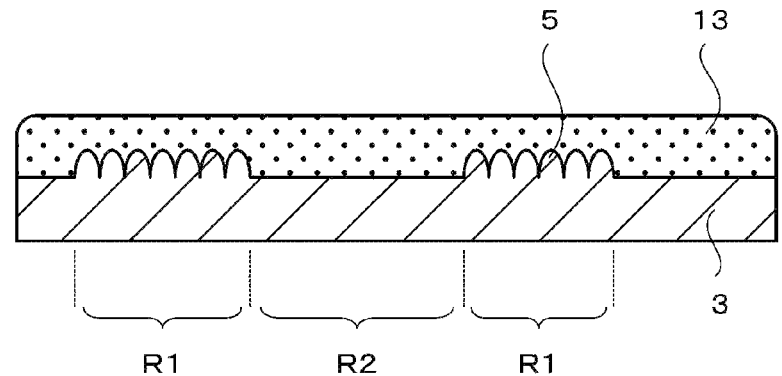
FIG. 11A to 11D A process chart for illustrating an example of a method of producing a wiring substrate according to a first embodiment of the present invention.
Figure 11B:
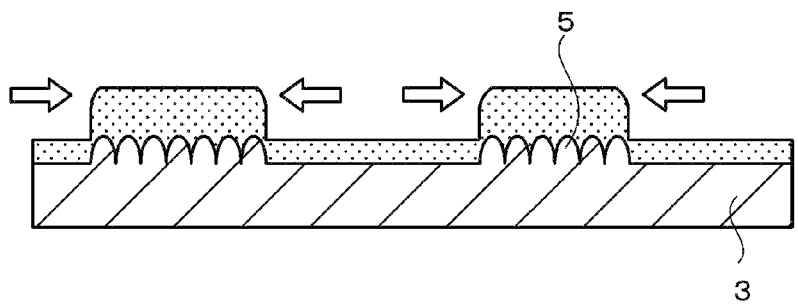
Figure 11C:
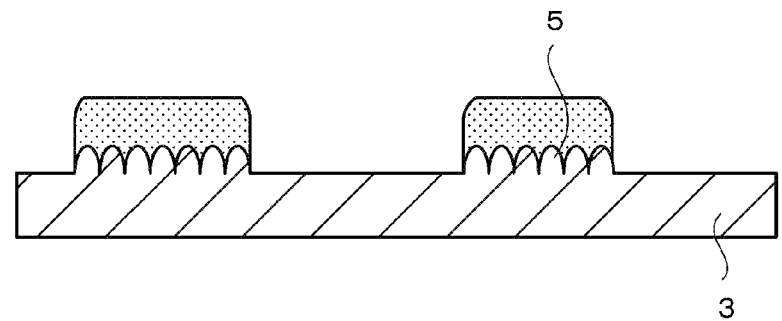

Next, the composition for forming a pattern layer 13 is continuously left on the first area among the first area and the second area on the surface of the substrate 3 on which the composition for forming a pattern layer 13 is coated. As shown in FIG. 11A, the composition for forming a pattern layer 13 covers the surface of the substrate 3 immediately after the substrate 3 is pulled up from the tank containing the composition for forming a pattern layer 13. Here, each of the first area among the first area and the second area has the convex/concave shape where the capillary phenomenon occurs in the composition for forming a pattern layer 13. Therefore, as shown in FIGS. 11B and 11C, the composition for forming a pattern layer 13 coated on the surface of the substrate 3 spontaneously aggregates on the first areas R1, but is not left on the second areas R2.

(Step of forming Pattern Layer)

Next, the composition for forming a pattern layer 13 continuously left on the first areas is solidified. Specifically, the composition for forming a pattern layer 13 is heated, dried, fired or in combination as appropriate. Alternatively, the composition for forming a pattern layer 13 continuously left on the first area R1 may be solidified by laser irradiation, a plasma treatment, energy line irradiation or the like.

Figure 11D:
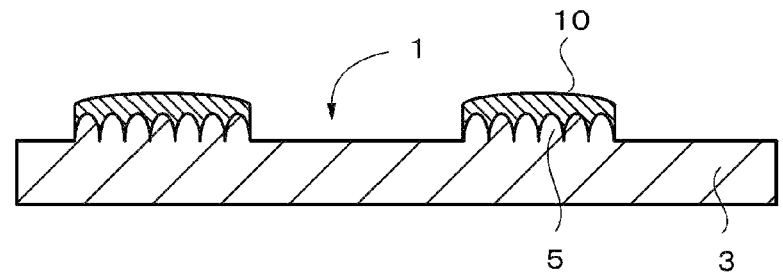

In this way, as shown in FIG. 11D, pattern layers 10 are formed at the first area R1. For example, when the composition for forming a pattern layer 13 contains a conductive material, spaces between the conductive material become minute such that each pattern layer 10 can be used as a wiring pattern or an electrode. A thickness of each pattern layer 10 can be controlled by a ratio of solvents in the composition for forming a pattern layer 13 or a wet film thickness of the composition for forming a pattern layer 13 coated.

Through the above-described steps, the wiring substrate 1 where the pattern layers 10 are formed at the first areas R1 can be provided. The composition for forming a pattern layer 13 spontaneously aggregates on the first areas R1, but is not left on the second areas R2. In other words, each pattern layer 10 formed at each first area R1 functions as the wiring pattern or the electrode, and each second area R2 functions as an insulation area between the wiring patterns.

According to the above-described production method, by preparing in advance the substrate 3 having the surface on which the first area and the second area are formed, once the composition for forming a pattern layer 13 is coated on the surface of the substrate 3, the composition for forming a pattern layer 13 can be left selectively on wiring parts. As a result, a step of forming the wiring pattern or the electrode can be simplified to improve the productivity. In addition, the wiring pattern may be a fine pattern, a large area pattern or a combination thereof. Since there is no need to determine whether or not the composition for forming a pattern layer 13 is coated, it is possible to form in a batch mode a combination of a mesh type transparent electrode and a wire drawing electrode and the like. For example, it can be applied to a large-sized display panel.

Modified Embodiment of First Embodiment

Figure 12A:
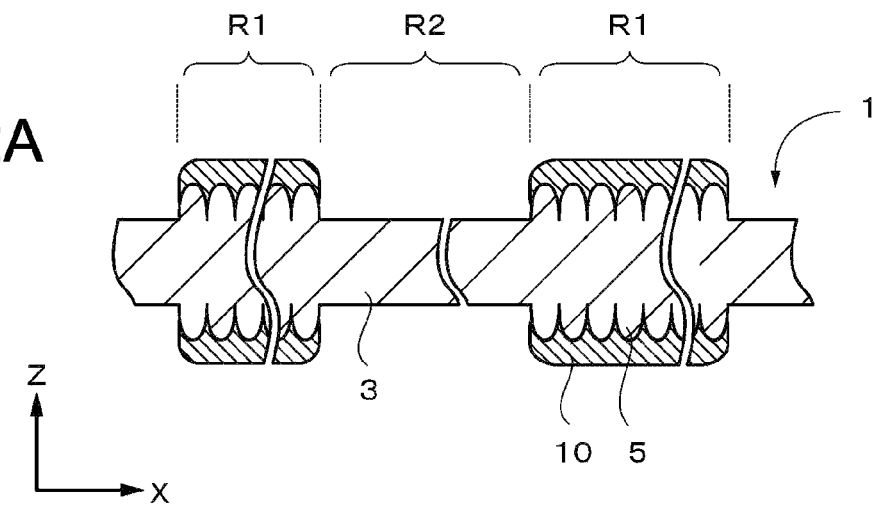
FIGS. 12A and 12B A schematic sectional view showing another structural example of the wiring substrate according to the first embodiment of the present invention.
Figure 12B:
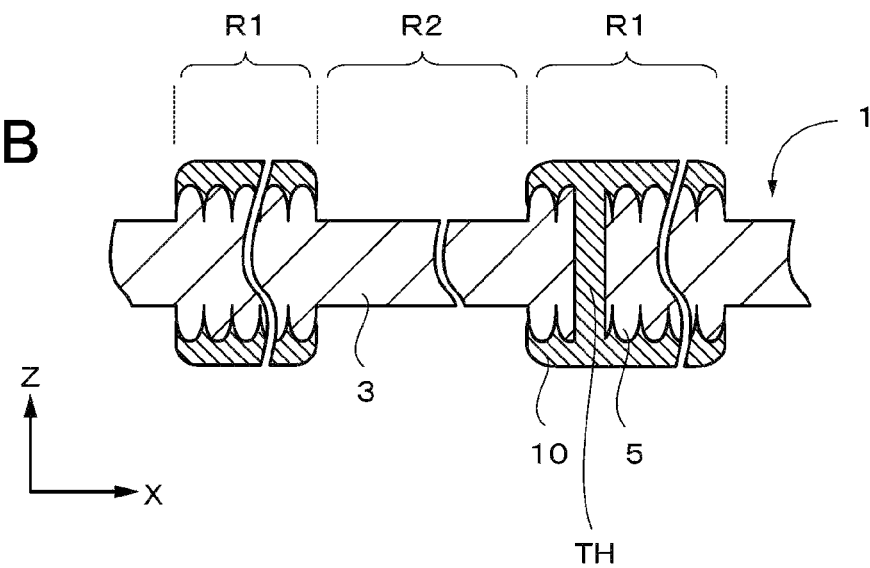

FIGS. 12A and 12B are each a schematic sectional view showing another structural example of the wiring substrate according to the first embodiment of the present invention. In the wiring substrate 1 shown in FIG. 12A, both major surfaces have each first area R1 and second area R2. Each pattern layer 10 is formed only on the first area R1 of the both areas, thereby the wiring is formed on the both surfaces of the substrate 3. As shown in FIG. 12B, a through hole TH is formed in the first area R1 of the substrate 3. The composition for forming a pattern layer may be injected into the through hole TH to form the conductive layer, and the wiring such as the circuit formed on the both surfaces of the substrate 3 may be electrically connected.

According to the above-described embodiment, as the wiring is formed on the both surfaces of the substrate 3, more circuits can be formed on the wiring substrate 1. In addition, when a plurality of the wiring substrates 1 is overlapped via spacers, the pattern layers 10 are formed, resulting in a multilayer wiring substrate.

2. Second Embodiment

Figure 13A:
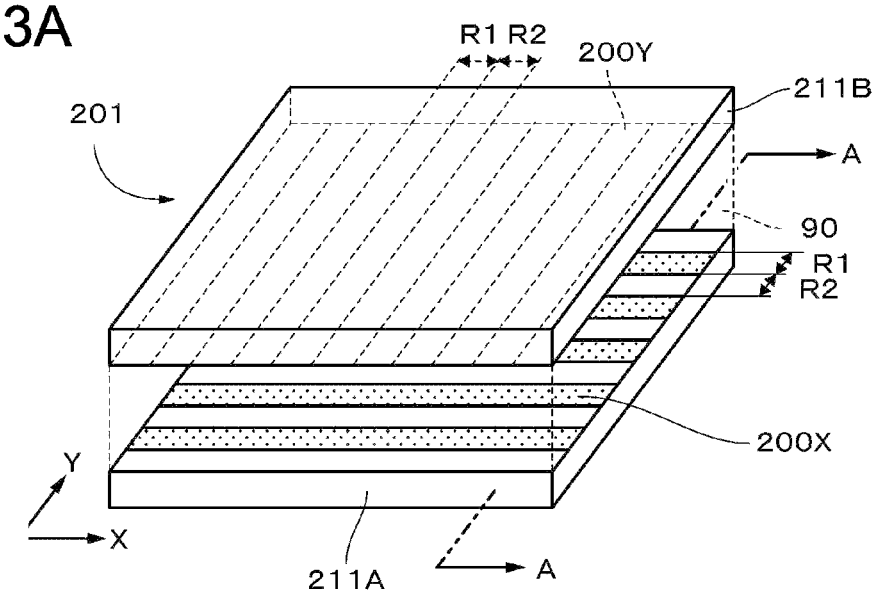
FIG. 13A A perspective view showing a structural example of a liquid crystal display according to a second embodiment of the present invention.
Figure 13B:
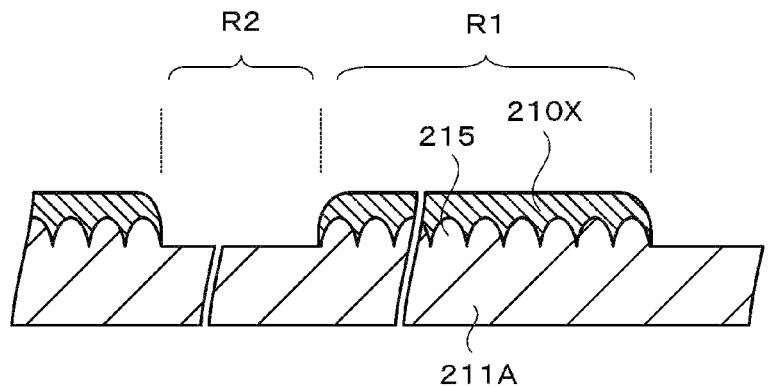
FIG. 13B A schematic sectional view along A-A showing the structural example of the liquid crystal display according to the second embodiment of the present invention.
Figure 13C:
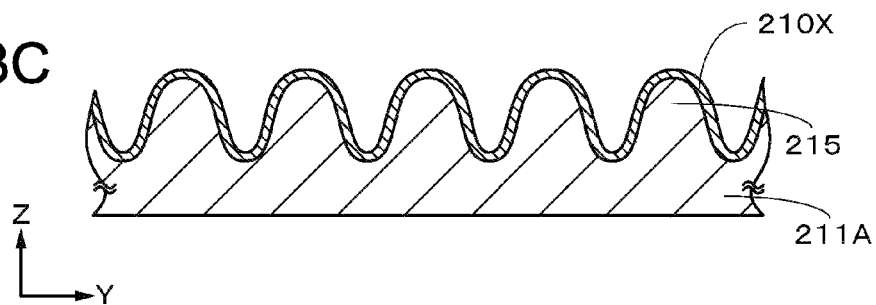
FIG. 13C A schematic sectional view showing by enlarging a part of a first area of the liquid crystal display according to the second embodiment of the present invention.

FIG. 13A is a perspective view showing a structural example of a liquid crystal display according to a second embodiment of the present invention. FIG. 13B is a schematic sectional view along A-A showing the structural example of the liquid crystal display according to the second embodiment of the present invention. FIG. 13C is a schematic sectional view showing by enlarging a part of a first area of the liquid crystal display according to the second embodiment of the present invention. As shown in FIG. 13A, a liquid display device 201 according to the second embodiment is a display device of a passive matrix drive system (also referred to as a simple matrix drive system), and comprises a first substrate 211A, a second substrate 211B, and a liquid crystal layer 90 disposed between the first substrate 211A and the second substrate 211B.

The first areas R1 and the second areas R2 are repeatedly configured in a band-like arrangement on one major surface facing to the second substrate 211B of the both surfaces of the first substrate 211A. The surface configuration of the first areas R1 and the second areas R2 on the first substrate 211A is similar to that on the substrate 3 according to the first embodiment as described above. For example, each pattern layer 210X that is a transparent conductive layer is formed at the first area R1 of the first area R1 and the second area R2. Each first area R1 has a convex/concave shape where a capillary phenomenon occurs in the composition for forming the pattern layer 210X to form each pattern layer. The convex/concave shape is configured by the aggregate of a plurality of structures 215. Accordingly, a plurality of horizontal (X) electrodes (first electrodes) 200X including the transparent conductive layer continuously formed is formed in a stripe-like arrangement on one major surface facing to the second substrate 211A of the both surfaces of the second substrate 211B.

The first areas R1 and the second areas R2 are repeatedly and alternately configured in a band-like arrangement on one major surface facing to the first substrate 211A of the both surfaces of the second substrate 211B. The surface configuration of the first areas R1 and the second areas R2 on the second substrate 211B is similar to that on the substrate 3 according to the first embodiment as described above. For example, each pattern layer 210Y that is a transparent conductive layer is formed at the first area R1 of the first area R1 and the second area R2. Each first area R1 has a convex/concave shape where a capillary phenomenon occurs in the composition for forming the pattern layer 210Y to form the pattern. The convex/concave shape is configured by the aggregate of the plurality of structures 215. Accordingly, a plurality of vertical (Y) electrodes (second electrodes) 200Y including the transparent conductive layers continuously formed is formed in a stripe-like arrangement on one major surface facing to the first substrate 211A of the both surfaces of the second substrate 211B.

The first areas R1 of the first substrate 211A and the first areas R1 of the second substrate 211B are orthogonal to each other. In other words, the horizontal electrodes 200X of the first substrate 211A and the vertical electrodes 200Y of the second substrate 211B are orthogonal to each other.

According to the second embodiment, the capillary phenomenon at the convex/concave shape formed at each first area R1 is utilized for the composition for forming a pattern layer and the composition for forming a pattern layer is continuously left on each first area R1, whereby the transparent electrode of the liquid crystal display can be produced.

For example, the convex/concave shape of the first area R1 may be a fine and minute convex/concave shape called as a Moth-eye. As shown in FIG. 13C, the surface shape of the aggregate of the structures 215 formed at each first area R1 and the transparent conductive layer are preferably similar. In other words, it is preferable that the arrangement pitch of the structures be smaller than the wavelength where a reflection is decreased, and the transparent conductive layer on each first area R1 that functions as the horizontal electrode 200X and the vertical electrode 200Y has the similar shape as that of the structures 215 formed at each first area R1. This is because it can inhibit a change in a refractive index profile due to the formation of the transparent conductive layer, and excellent antireflection properties and/or transmission properties can be kept. FIG. 13C schematically shows an enlarged part of the first area in the first substrate 211A. The same applies to the second substrate 211B.

When the transparent conductive layer has the shape similar to that of the structures 215 formed at the first area R1, it is preferable that an average layer thickness of the pattern layer on each first area R1 be not more than 400 nm. When the average layer thickness is not more than 400 nm, a decrease in a visibility caused by a decrease in the refractive index and the transmittance can be suppressed.

The aggregate of the structures may be formed at the second areas R2 as long as the capillary phenomenon does not occurs in the composition for forming a pattern layer. In this case, when the structures formed at the second areas R2 become sub-wavelength structures, the transparent electrode formed at the first area R1 can be further obscured which is favorable.

3. Third Embodiment

Figure 14:
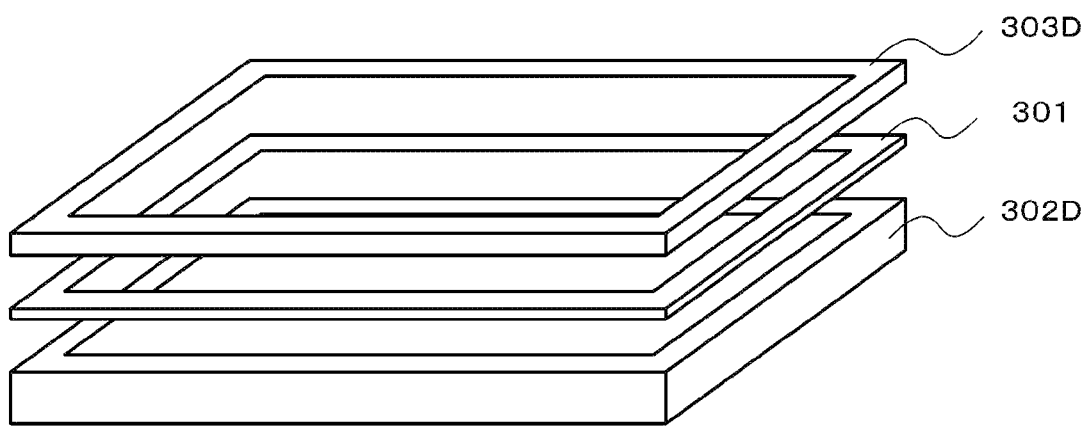
FIG. 14 A perspective view showing a structural example of an information input apparatus according to a third embodiment of the present invention.

FIG. 14 is a perspective view showing a structural example of an information input apparatus according to a third embodiment of the present invention. The information input apparatus according to the third embodiment is a display apparatus including a touch panel. As shown in FIG. 14, the touch panel (information input apparatus) 301 is disposed on a display apparatus 302D. The display apparatus 302D and the touch panel 301 are adhered, for example, via an adhesive agent. A front panel (a surface member) 303D may be further disposed on a surface of the touch panel 301. The touch panel 301 and the front panel (the surface member) 303D are adhered, for example, via an adhesive agent.

As the display apparatus 302D, a wide variety of display apparatuses including liquid crystal display, a CRT (Cathode Ray Tube) display, a PDP (Plasma Display Panel), an EL (Electro Luminescence) display, an SED (Surface-conduction Electron-emitter Display) and the like can be used, for example. The touch panel 301 is, for example, a resistive-membrane or capacitive touch panel. An example of the resistive-membrane touch panel is a matrix resistive-membrane touch panel. An example of the capacitive touch panel is a Wire Sensor or ITO Grid projective capacitive touch panel.

Figure 15A:
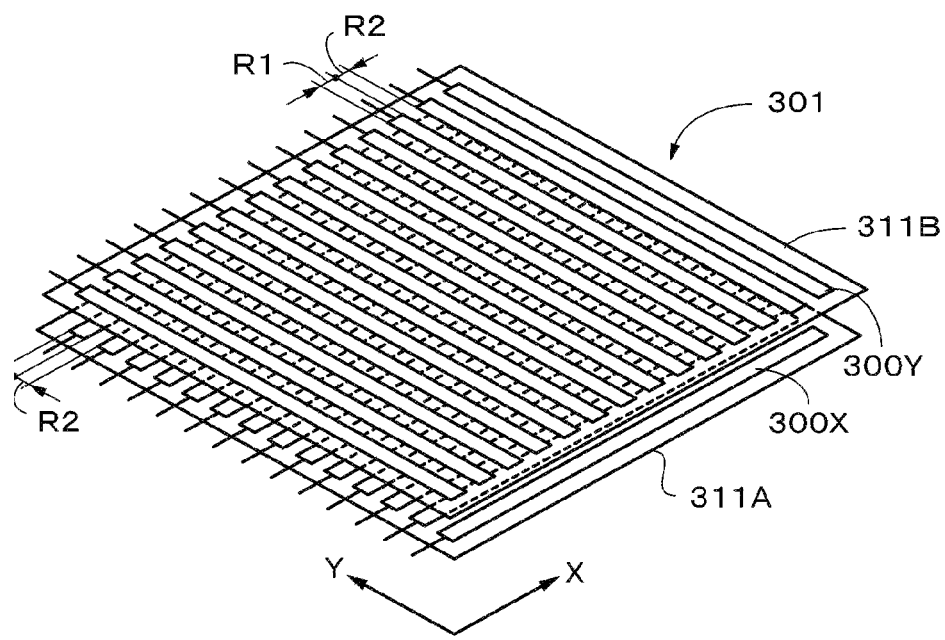
FIG. 15A A perspective view showing a first structural example of a touch panel according to a third embodiment of the present invention.

FIG. 15A is a perspective view showing a first structural example of a touch panel according to the third embodiment of the present invention. The touch panel 301 is the matrix resistive-membrane touch panel, and has a first substrate 311A and a second substrate 311B that are disposed facing each other at a predetermined space via a dot spacer (not shown).

Figure 15B:
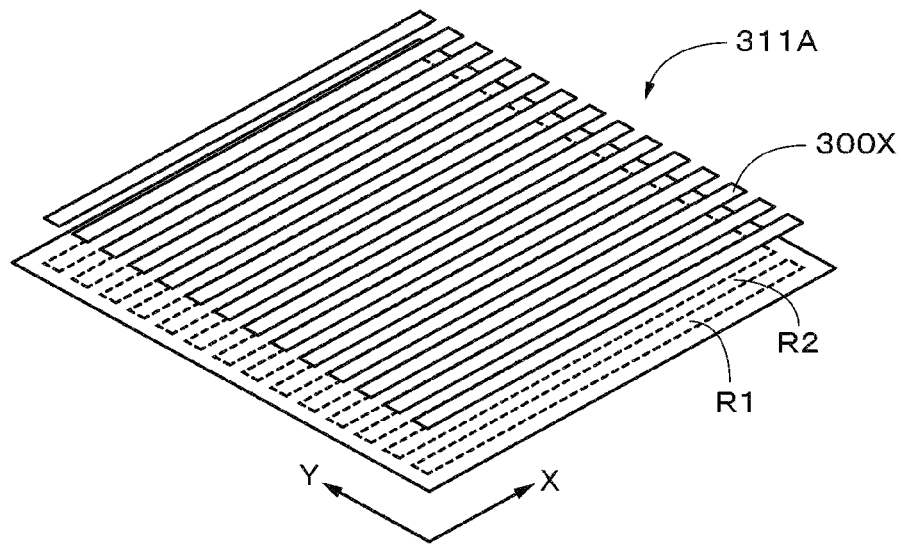
FIG. 15B An exploded perspective view showing a structural example of a first substrate.

FIG. 15B is an exploded perspective view showing a structural example of a first substrate. Since the second substrate 311B has the almost same configuration as the first substrate 311A, an exploded perspective view is not shown. The first areas R1 and the second areas R2 are repeatedly and alternately configured in a rectangular arrangement on one major surface facing to the second substrate 311B of the both surfaces of the first substrate 311A. The surface configuration of the first areas R1 and the second areas R2 on the second substrate 311A is similar to that on the substrate according to any of the embodiments as described above. For example, a pattern layer that is a transparent conductive layer is formed at each first area R1 of the first area R1 and the second area R2. Each first area R1 has a convex/concave shape where a capillary phenomenon occurs in the composition for forming a pattern layer to form a pattern layer. The convex/concave shape is configured by an aggregate of a plurality of structures. Accordingly, a plurality of horizontal (X) electrodes (first electrodes) 300X including the transparent conductive layers continuously formed is formed in a stripe-like arrangement on one major surface facing to the second substrate 311B of the both surfaces of the first substrate 311A.

The first areas R1 and the second areas R2 are repeatedly and alternately configured in a rectangular arrangement on one major surface facing to the first substrate 311A of the both surfaces of the second substrate 311B. The surface configuration of the first areas R1 and the second areas R2 on the second substrate 311B is similar to that on the substrate according to any of the embodiments as described above. For example, a pattern layer that is a transparent conductive layer is formed at each first area R1 of the first area R1 and the second area R2. Each first area R1 has a convex/concave shape where a capillary phenomenon occurs in the composition for forming a pattern layer to form a pattern. The convex/concave shape is configured by an aggregate of a plurality of structures. Accordingly, a plurality of vertical (Y) electrodes (second electrodes) 300Y including the transparent conductive layers continuously formed is formed in a stripe-like arrangement on one major surface facing to the first substrate 311A of the both surfaces of the second substrate 311B.

The first areas R1 of the first substrate 311A and the first areas R1 of the second substrate 311B are orthogonal to each other. In other words, the horizontal electrodes 300X of the first substrate 311A and the vertical electrodes 300Y of the second substrate 311B are orthogonal to each other.

Figure 16A:
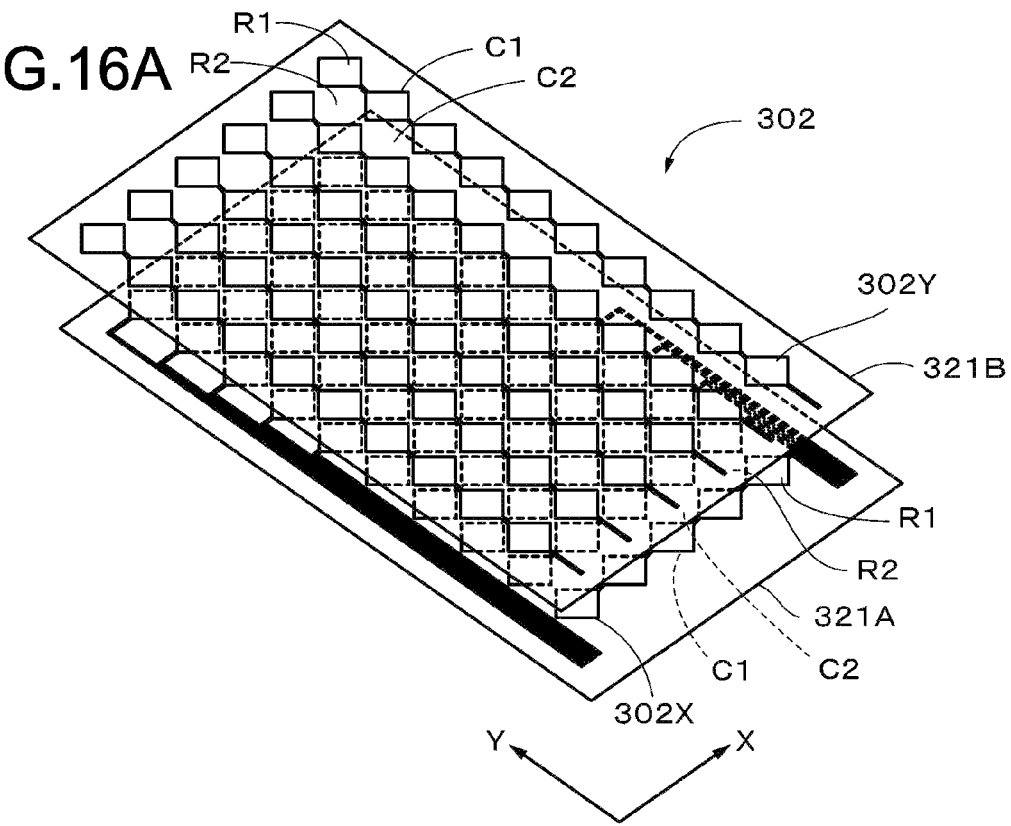
FIG. 16A A perspective view showing a second structural example of a touch panel according to the third embodiment of the present invention.

FIG. 16A is a perspective view showing a second structural example of a touch panel according to the third embodiment of the present invention. The touch panel is the ITO Grid projective capacitive touch panel, and has the first substrate 321A and the second substrate 321B that are overlapped.

Figure 16B:
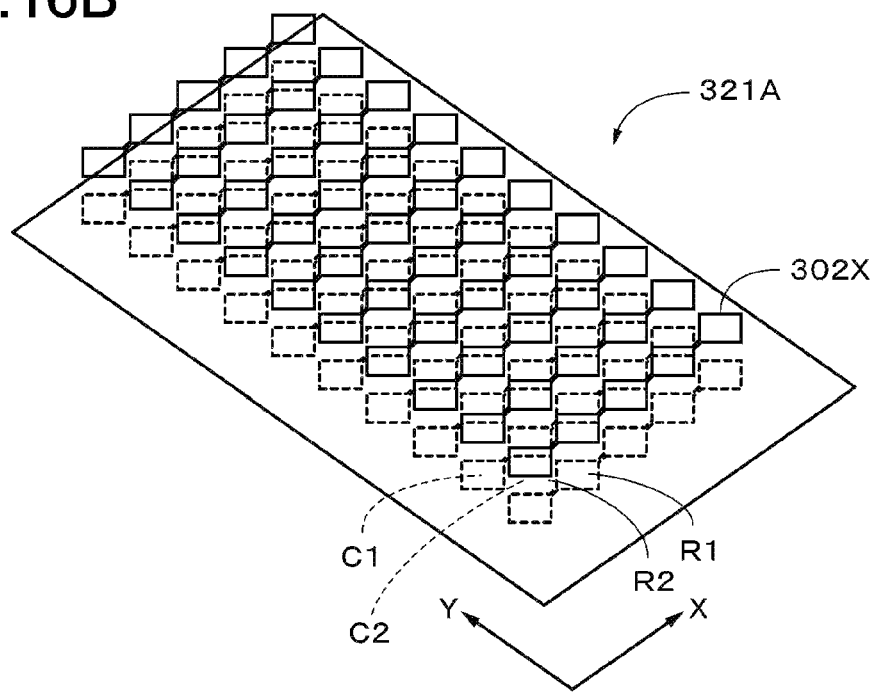
FIG. 16B An exploded perspective view showing a structural example of a first substrate 321A.

FIG. 16B is an exploded perspective view showing a structural example of a first substrate 321A. Since the second substrate 321B has the almost same configuration as the first substrate 321A, an exploded perspective view is not shown. The first areas R1 and the second areas R2 are repeatedly and alternately configured on one major surface facing to the second substrate 321B of the both surfaces of the first substrate 321A, and adjacent first areas R1 are separated by the second areas R2. The first areas R1 and the second areas R2 are repeatedly and alternately configured on one major surface facing to the first substrate 321A of the both surfaces of the second substrate 321B, and adjacent first areas R1 are separated by the second area R2. The surface configuration of the first areas R1 and the second areas R2 on the first substrate 321A and the second substrate 321B is similar to that on the substrate according to any of the embodiments as described above.

In the first areas R1 of the first substrate 321A, unit areas C1 each having a predetermined shape are connected repeatedly in an X axis direction. In the second areas R2, unit areas C2 each having a predetermined shape are connected repeatedly in a Y axis direction. In the first areas R1 of the first substrate 321B, unit areas C1 each having a predetermined shape are connected repeatedly in an Y axis direction. In the second areas R2, unit areas C2 each having a predetermined shape are connected repeatedly in a Y axis direction. Examples of the shape of the unit areas C1 and the unit areas C2 include a diamond shape (a rhombic shape), a triangle shape, a square shape and the like, but are not limited thereto.

A pattern layer that is a transparent conductive layer is formed at each first area R1 of the first area R1 and the second area R2 on the respective surfaces of the first substrate and the second substrate. Each first area R1 has a convex/concave shape where a capillary phenomenon occurs in the composition for forming the pattern layer to form a pattern layer. The convex/concave shape is configured by an aggregate of a plurality of structures. Accordingly, a plurality of horizontal (X) electrodes (first electrodes) 302X including the transparent conductive layers is formed on one major surface facing to the second substrate 321B of the both surfaces of the first substrate 321A. In addition, a plurality of vertical (Y) electrodes (second electrodes) 302Y including the transparent conductive layers is formed on one major surface facing to the first substrate 321A of the both surfaces of the second substrate 321B. The horizontal electrode 302X and the vertical electrode 302Y have the similar shape as those in the second area R2.

The horizontal electrodes 302X of the first substrate 321A and the vertical electrodes 302Y of the second substrate 321B are orthogonal to each other. By overlapping the first substrate 321A with the second substrate 321B, each first area R1 of the first substrate 321A is overlapped with each second area R2 of the second substrate 321B, and each second area R2 of the first substrate 321A is overlapped with each first area R1 of the second substrate 321B.

According to the third embodiment, the capillary phenomenon at the convex/concave shape formed at the first area R1 is utilized for the composition for forming a pattern layer and the composition for forming a pattern layer is continuously left on the first area R1, whereby the transparent electrode of the touch panel can be produced. Since there is no need to determine whether or not the composition for forming a pattern layer is coated, it is possible to form in a batch mode a transparent electrode pattern and a wire drawing electrode without requiring any complex step.

4. Fourth Embodiment

Figure 17:
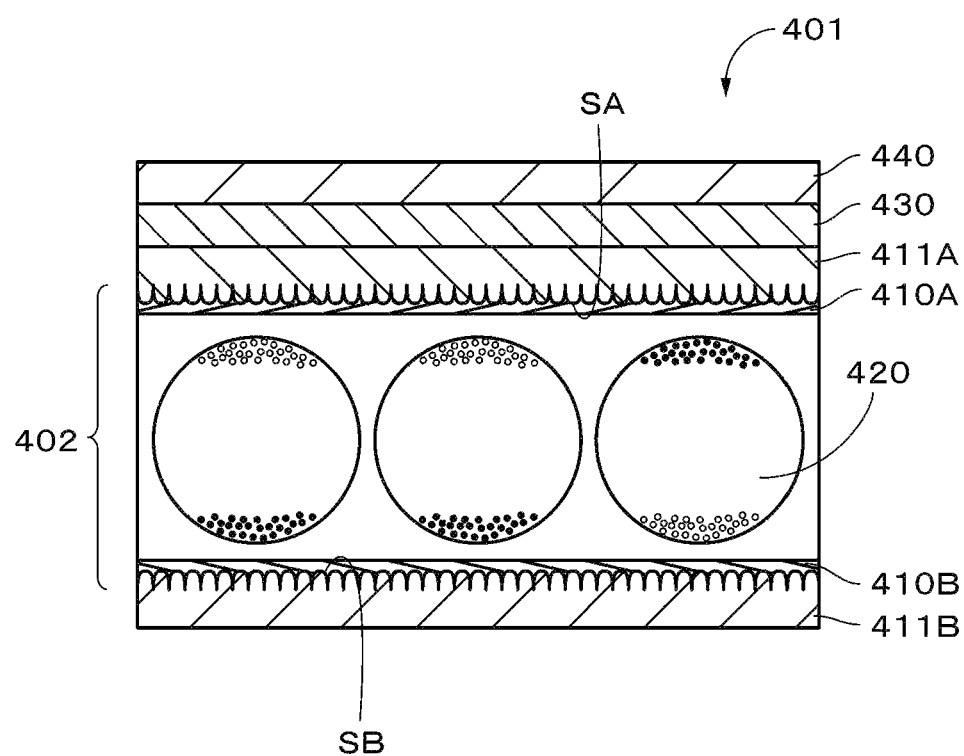
FIG. 17 A schematic sectional view showing an example of a display apparatus according to a fourth embodiment of the present invention.

FIG. 17 is a schematic sectional view showing an example of a display apparatus according to a fourth embodiment of the present invention. The display apparatus 401 is so-called electronic paper utilizing microcapsule electrophoresis, and includes a first substrate 411A, a second substrate 411B disposed facing to the first substrate 411A, and a microcapsule layer (a medium layer) 402 disposed between the both elements. Herein, the present invention is applied to the electronic paper utilizing the microcapsule electrophoresis. The electronic paper is not limited to the embodiment. As long as the medium layer is disposed between the pattern substrates disposed facing each other, the present invention can be applied thereto. Herein, the medium contains a gas such as air as well as a liquid and a solid. Also, the medium may contain a member such as a capsule, a pigment and a particle. Examples of the electronic paper other than that utilizing the microcapsule electrophoresis include a twist ball, thermal rewritable, toner display, In-Plane microcapsule electrophoresis, and electronic powder particle electronic paper.

The microcapsule layer 402 contains a number of microcapsules 420. For example, a transparent liquid (dispersion medium) where black particles and white particles are dispersed is enclosed in the microcapsule.

The first substrate 411A includes the first area and the second area on a surface SA facing to the second substrate 411B. The first area among the first area and the second area includes a first transparent conductive layer 410A. The second substrate 411B includes the first area and the second area on a surface SB facing to the first substrate 411A. The first area among the first area and the second area includes a second transparent conductive layer 410B. As appropriate, the first substrate 411A may be adhered to a support 440 such as a glass via an adhesive layer 430 such as an adhesive agent.

The first transparent conductive layer 410A and the second transparent conductive layer 410B are formed in a predetermined electrode pattern depending on a drive system of the electronic paper 401. Examples of the drive system include a simple matrix drive system, an active matrix drive system and a segment drive system.

According to the fourth embodiment, the capillary phenomenon at the convex/concave shape formed at the first area R1 is utilized for the composition for forming a pattern layer and the composition for forming a pattern layer is continuously left on the first area R1, whereby the transparent electrode of the electronic paper can be produced. Since there is no need to determine whether or not the composition for forming a pattern layer is coated, it is possible to form in a batch mode a transparent electrode pattern and a wire drawing electrode without requiring any complex step.

5. Fifth Embodiment

Figure 18A:
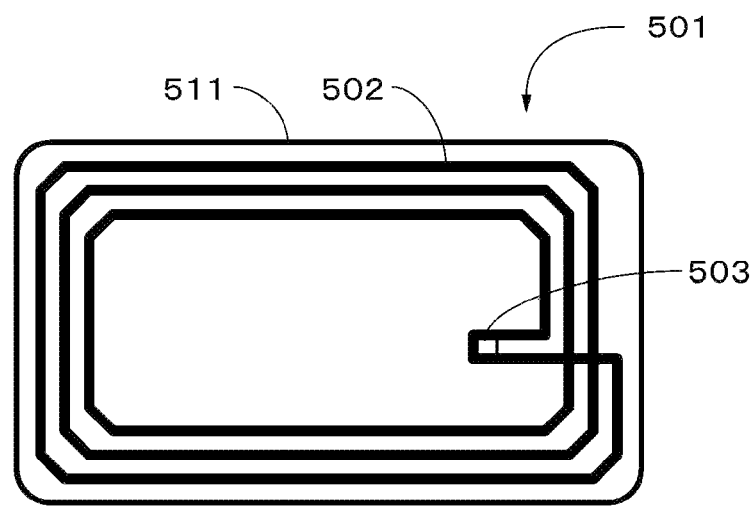
FIG. 18A A plan view showing a structural example of an IC (Integrated Circuit) according to a fifth embodiment of the present invention.
Figure 18B:
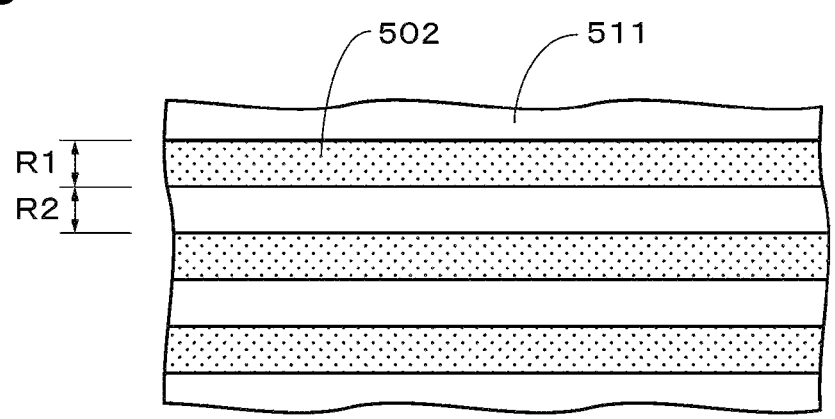
FIG. 18B A plan view showing by enlarging a part of the IC card shown in FIG. 18A.

FIG. 18A is a plan view showing a structural example of an IC (Integrated Circuit) according to a fifth embodiment of the present invention. FIG. 18B is a plan view showing by enlarging a part of the IC card shown in FIG. 18A. An IC card 501 is a so-called non-contact IC card, and includes a substrate 511, an antenna coil 502 and an IC chip 503. Both ends of the antenna coil 502 are connected to the IC chip 503. At both surfaces of the substrate 511, a jacket material (not shown) is disposed.

The substrate 511 can have a non-limiting shape of a film, a sheet or a plate, which can be selected and used depending on the properties needed for the IC card 501. It is preferable that the material of the substrate 511 be a resin material having flexibility for durability and convenience. Non-limiting examples of the resin material include polyethylene naphthalate (PEN), polyethylene terephthalate (PET), polyimide (PI) and polyester. Conventionally known resin materials can be selected and used depending on the properties needed for the IC card.

For example, the first areas R1 and the first area R2 are formed spirally and alternately at a marginal portion on a major surface of the substrate 511. The surface configuration of the first areas R1 and the second areas R2 on the substrate 511 is similar to that on the pattern substrate according to any of the embodiments as described above. For example, a pattern layer that is a conductive layer is formed at each first area R1 of the first area R1 and the second area R2. Each first area R1 has a convex/concave shape where a capillary phenomenon occurs in the composition for forming a pattern layer. The convex/concave shape is configured by an aggregate of a plurality of structures. Accordingly, an antenna coil 502 including a conductive layer continuously formed is formed at the marginal portion on the major surface of the substrate 511 along the shape of the first area R1. The structures having a different aspect ratio or the like may be formed on the respective first area R1 and the second area R2.

The jacket material constitutes front and back surfaces of the IC card, and contains as a main component a non-limiting polymer material such as polyethylene terephthalate (PET), polybutyl terephthalate (PBT), polyethylene glycol (PEG), oriented PET and the like. Conventionally known resin materials can be selected and used depending on the properties needed for the IC card.

The antenna coil 502 is an electromagnetic induction coil having a loop coil shape formed by winding on the substrate 511 multiple times. Both ends thereof are connected to the IC chip 503. The antenna coil 502 receives an alternating magnetic field generated from a reader/writer to induce an alternating voltage, and supplies the alternating voltage to the IC chip 503.

The IC chip 503 is driven by the electric power supplied from the antenna coil 502 and controls various components inside the IC card 501. For example, the IC chip 503 communicates with the reader/writer through the antenna coil 502. Specifically, the IC chip 503 performs, for example, mutual authentication and data exchange with the reader/writer.

According to the fifth embodiment, the capillary phenomenon at the convex/concave shape formed at the first area R1 is utilized for the composition for forming a pattern layer and the composition for forming a pattern layer is continuously left on the first area R1, whereby the antenna coil for the IC card can be produced. Since there is no need to determine whether or not the composition for forming a pattern layer is coated, it is possible to improve the productivity of the IC card without requiring any complex step.

6. Sixth Embodiment

Figure 19A:
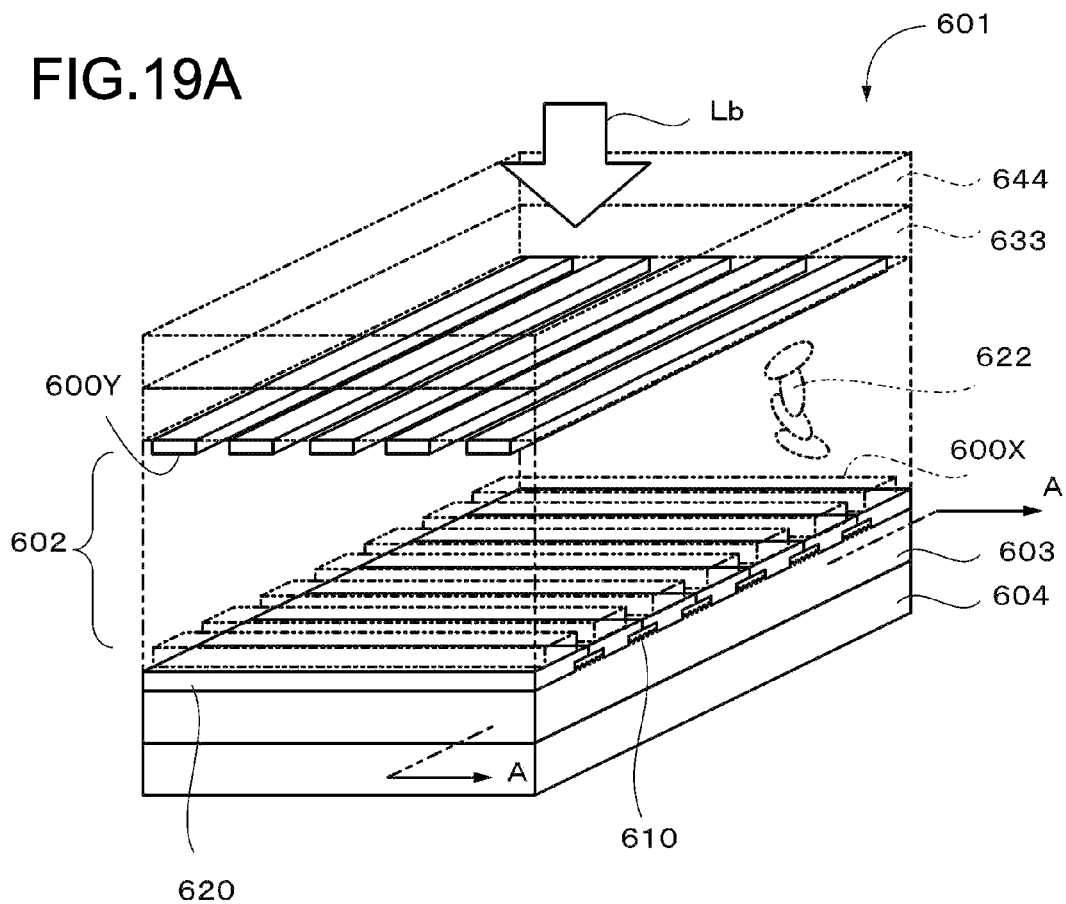
FIG. 19A A perspective view showing a structural example of a display device according to a sixth embodiment of the present invention.
Figure 19B:
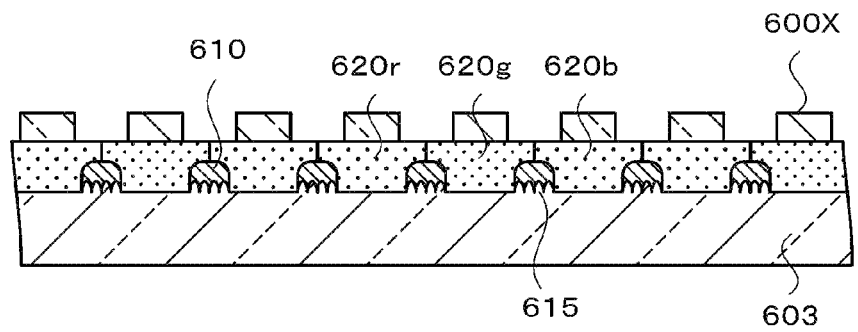
FIG. 19B A schematic sectional view along A-A in FIG. 19A.

FIG. 19A is a perspective view showing a structural example of a display device according to a sixth embodiment of the present invention. FIG. 19B is a schematic sectional view along A-A in FIG. 19A. As shown in FIG. 19A, a display device 601 according to the sixth embodiment is a display device of a passive matrix drive system, and includes a laminate of a polarization filter 604 and a substrate 603 and a laminate of a transparent substrate 633 and a polarization filter 644, the laminates being disposed facing each other at a predetermined space. Between the substrate 603 and the transparent substrate 633, a liquid crystal layer 602 containing liquid crystal molecules 622 is disposed. A light Lb from a back light is observed by passing through the polarization filter 644, the transparent substrate 633, the liquid crystal layer 602, a colored layer 620, the substrate 603 and the polarization filter 604 in this order. Herein, the present invention is applied to the liquid crystal display device used as the display device. The display device is not limited to the embodiment. As long as the display device includes a color filter, the present invention can be applied thereto. Examples of the display device other than the liquid crystal display device to which the present invention can be applied include an EL device.

On a major surface facing to the transparent substrate 633 of both major surfaces of the substrate 603, a plurality of horizontal (X) electrodes 600X including colored layers 620r, 620g and 620b that transmit lights in wavelength bands of red, green and blue, and a transparent conducive layer are formed in a stripe-like arrangement. On a major surface facing to the substrate 603 of the substrate 633, a plurality of vertical (Y) electrodes 600Y each including a transparent conducive layer is formed in a stripe-like arrangement.

On a major surface facing to the transparent substrate 633 of the both major surfaces of the substrate 603, net-like first areas R1 are set, and second areas R2 are set to be laid out in the first areas R1. The surface configuration of the first areas R1 and the second areas R2 on the substrate 603 is similar to that on the substrate 3 according to any of the embodiments as described above. As shown in FIG. 19B, a black layer 610 that is a light shielding layer is formed at each first area R1 of the first area R1 and the second area R2. Each first area R1 has a convex/concave shape where a capillary phenomenon occurs in the composition for forming a pattern layer to form the black layer 610. The convex/concave shape is configured by an aggregate of a plurality of structures 615. On each second area R2, the colored layers 620r, 620g and 620b are formed. Thus, a color filter of the display device is configured by the substrate 603, the colored layer 620 and the black layer 610. The black layer 610 constitutes a so-called black matrix.

FIGS. 20A to 20E are a process chart for illustrating an example of a method of producing a color filter constituting the display device according to the sixth embodiment of the present invention.

First, as shown in FIG. 20A, the substrate 603 where the first areas R1 and the second areas R2 are formed is prepared. The aggregate of the plurality of the structures 615 is formed at each first area R1 of the first area R1 and the second area R2.

Next, as shown in FIG. 20B, the surface of the substrate 603 where the first areas R1 and the second areas R2 are formed is coated with a composition for forming a pattern layer 613.

Next, the composition for forming a pattern layer 613 is continuously left on each first area R1 of the first area R1 and the second area R2 on the surface of the substrate 603 on which the composition for forming a pattern layer 613 is coated. Each first area R1 of the first area R1 and the second area R2 has the convex/concave shape where the capillary phenomenon occurs in the composition for forming a pattern layer 613. Therefore, the composition for forming a pattern layer 613 coated on the surface of the substrate 603 spontaneously aggregates on the first areas R1, but is not left on the second areas R2.

As a pigment that is mixed with the composition for forming a pattern layer 613, a black coloring agent can be used, for example. Examples of the black coloring agent include carbon black and titanium black.

Next, as shown in FIG. 20C, the composition for forming a pattern layer 613 continuously left on the first areas R1 is solidified by heating, drying, firing, laser irradiation, a plasma treatment, energy line irradiation or the like to form the black layer 610.

Next, as shown in FIG. 20D, the colored layers 620r, 620g and 620b are formed. For the formation of the colored layers 620r, 620g and 620b, known methods such as an etching method, a staining method, an electrodeposition method, a printing method and the like can be used.

Next, as shown in FIG. 20E, the transparent electrodes 600X are formed. For the formation of the transparent electrodes 600X, a film forming method by a dry process or a wet process can be used, for example. Specific film forming method can use a chemical production method or a physical production method. Examples of the chemical production method include a CVD (Chemical Vapor Deposition) method such as a thermal CVD, a plasma CVD and a light CVD, a spray method, a dip method, a powder coating method and the like. Examples of the physical production method include a vacuum deposition method, a sputtering method, an ion plating method, a pulse laser deposition method and the like. In order to protect the colored layers 620r, 620g and 620b, after an overcoat layer may be formed, the transparent electrodes 600X may be formed.

According to the sixth embodiment, the capillary phenomenon at the convex/concave shape formed at the first area R1 is utilized for the composition for forming a pattern layer and the composition for forming a pattern layer is continuously left on the first areas R1, whereby the color filter of the display device can be produced.

EXAMPLES

Hereinafter, the present invention will be described in detail by Examples. It should be noted that the present invention is not limited to the embodiments.

(Sample 1-1)

A quartz master was prepared by forming concave nano structures on a first area Rm1 of forming surfaces. Next, the quartz master on which the nano structures were formed was coated with a ultraviolet ray curing resin, was intimately contacted with a PET (polyethylene terephthalate) sheet having an easy adhesive layer, and was irradiated with a ultraviolet ray to cure and then peel the PET sheet. In this way, a resin sheet (hereinafter referred to as a pattern substrate, as appropriate) was provided where a number of convex nano structures was formed at the first area of the surface of the PET sheet. A pitch P of the structures was 250 nm, and an aspect ratio A was 1.0. The structures were disposed in a hexagonal grid pattern. A line/space ratio (hereinafter referred to as L/S as appropriate) that is a ratio of the first area and the second area was set to 0.5 mm/0.5 mm.

Next, the pattern substrate was immersed in the composition for forming a pattern layer to coat the surface of the pattern substrate where the first area R1 and the second area R2 were formed with the composition for forming a pattern. The composition for forming a pattern layer is shown as follows:

Conductive material: Ag nano particles (particle diameter: 10 nm), 5 wt %

Binder: Octadecanethiol, 1 wt %

Solvent: Ethylene glycol, 94 wt %

Hereinafter, the composition for forming a pattern layer having the above-described composition is described as Dispersion A.

When 1 μL of Dispersion A was dropped onto the pattern substrate, the following values were obtained.

A contact angle $\theta 1$ when Dispersion A was dropped onto the first area R1: 125 degrees A contact angle $\theta 2$ when Dispersion A was dropped onto the second area R2: 97 degrees A measuring apparatus used for a measurement of the contact angle is shown below:

Measuring apparatus: a contact angle meter CA-XE type manufactured by Kyowa Interface Science Co., LTD.

Next, the pattern substrate on which Dispersion A was coated was allowed to stand at 25° C. for 10 min to leave Dispersion A on the first area R1, and then fired at 120° C. for 60 min to provide a pattern substrate of a sample 1-1.

(Sample 1-2)

A pattern substrate of a sample 1-2 was provided similar to the sample 1-1 except that the aspect ratio A was 1.2. When 1 μL of Dispersion A was dropped onto the pattern substrate, the following values were obtained.

A contact angle $\theta 1$ when Dispersion A was dropped onto the first area R1: 145 degrees A contact angle $\theta 2$ when Dispersion A was dropped onto the second area R2: 99 degrees (Sample 1-3)

A pattern substrate of a sample 1-3 was provided similar to the sample 1-1 except that the arrangement pitch P was 300 nm. When 1 μL of Dispersion A was dropped onto the pattern substrate, the following values were obtained.

A contact angle $\theta 1$ when Dispersion A was dropped onto the first area R1: 127 degrees A contact angle $\theta 2$ when Dispersion A was dropped onto the second area R2: 96 degrees (Sample 1-4)

A pattern substrate of a sample 1-4 was provided similar to the sample 1-1 except that the composition for forming a pattern layer was as follows:

The following shows the composition for forming a pattern layer.

Conductive material: Ag nano particles (particle diameter: 10 nm), 5 wt %

Binder: Octadecanethiol, 1 wt %

Solvent: Octane, 94 wt %

Hereinafter, the composition for forming a pattern layer having the above-described composition is described as Dispersion B.

When 1 μL of Dispersion B was dropped onto the pattern substrate, the following values were obtained.

A contact angle $\theta 1$ when Dispersion B was dropped onto the first area R1: 54 degrees A contact angle $\theta 2$ when Dispersion B was dropped onto the second area R2: 60 degrees (Sample 1-5)

A pattern substrate of a sample 1-5 was provided similar to the sample 1-1 except that the aspect ratio A was 0.6. When 1 μL of Dispersion A was dropped onto the pattern substrate, the following values were obtained.

A contact angle $\theta 1$ when Dispersion A was dropped onto the first area R1: 116 degrees A contact angle $\theta 2$ when Dispersion A was dropped onto the second area R2: 97 degrees (Evaluation of Pattern Formation)

A pattern formation in each of the samples 1-1 to 1-5 was evaluated whether or not there is a problem. The pattern was visually determined whether or not a desired pattern was obtained.

Table 1 shows evaluation results of the samples 1-1 to 1-5. In Table 1, when the evaluation of the pattern formation of the sample was "Good", the pattern layer (the conductive layer) having the desired pattern was formed. On the other hand, when the evaluation of the pattern formation of the sample was "Not good", no continuous conductive layer was formed.

TABLE 1

| | | Structure | | | Contact angle | | Pattern |
|---|---|---|---|---|---|---|---|
| | Dispersion | Pitch | Height | Aspect ratio | $\theta 1$ | $\theta 2$ | formation |
| Samle1-1 | A | 250 nm | 250 nm | 1.0 | 125° | 97° | Good |
| Samle1-2 | A | 250 nm | 300 nm | 1.2 | 145° | 99° | Good |
| Samle1-3 | A | 300 nm | 300 nm | 1.0 | 127° | 96° | Good |
| Samle2-1 | B | 250 nm | 250 nm | 1.0 | 54° | 60° | Not good |
| Samle2-2 | A | 250 nm | 150 nm | 0.6 | 116° | 97° | Not good |

Table 1 reveals the followings:

No continuous conductive layer was formed at the first area of the pattern substrates of the samples 1-4 and 1-5. In contrast, the conductive layers having the desired pattern were formed on the pattern substrates of the samples 1-1 to 1-3. Accordingly, the capillary phenomenon at the convex/concave shape formed at the first area R1 is utilized for the composition for forming a pattern layer and the composition for forming a pattern layer is continuously left on the first area R1, whereby the conductive pattern part can be selectively formed at the first area R1, and the conductive pattern such as the wiring substrate can be produced.

In other words, when the substrate having the surface on which the first area R1 and the second area R2 are formed in advance by transferring the pattern by nanoimprint or the like, the composition for forming a pattern layer can be left selectively on the wiring parts only by coating the surface of the substrate with the composition for forming a pattern layer. As a result, a step of forming the patterns can be simplified.

7. Modified Embodiments

Although particular embodiments of the present invention have been illustrated and described, the present invention is not intended to be limited to the above-described particular embodiments, and various modifications and alterations can be made based on the technical spirit of the present invention.

For example, the configurations, the methods, the steps, the shapes, the materials, the numerical values and the like described in the embodiments and examples are only examples. Different configurations, methods, steps, shapes, materials, numerical values and the like may be used as appropriate.

The configurations, the methods, the steps, the shapes, the materials, the numerical values and the like described in the embodiments and examples can be combined without departing from the scope of the present invention.

Although the structures formed on the roll master are transferred in the above-described embodiments, the present invention is not intended to be limited to the above-described particular embodiments and a rectangular master, a disk master or the like may be used.

Also, although the structures formed at the first area have convex shapes, the structures having concave shapes by inverting the convex shapes shown in FIG. 3A may be used.

In addition, although the present invention is applied to a monolayer pattern substrate on which the wiring and/or the electrode are formed one or both sides thereof in the above-described embodiments, the present invention is not limited thereto and can be applied to a multilayer pattern substrate.

Furthermore, although the wiring and/or the electrode are formed on the flat surface substrate in the above-described embodiments, the wiring is not only formed on the flat surface substrate, but also formed on a curved surface substrate.

The pattern layer is used not only to the wiring and/or the electrode, but also to the formation of an organic or inorganic transistor device, a memory device, an emission member such as an antenna and the like. As appropriate, a metal layer may be laminated on the pattern layer by plating. Also, it is possible to be applied as an infrared reflection coating, a ultraviolet reflection coating, a gold or silver decorative coating or a catalyst coating.

Although, in the above-described embodiment, the present invention is applied to the projective capacitive touch panel having a configuration that two substrates are overlapped, the present invention is not limited thereto. For example, the present invention can be applied to a projective capacitive touch panel having a configuration that electrodes are formed on both surfaces of one substrate.

Although, in the above-described embodiment, the present invention is applied to the color filter of the display device using the composition for forming a pattern layer containing the pigment, the present invention is not limited thereto. For example, the pigment is not limited to the black coloring agent, and other coloring agent may be used. For example, a pattern etc. can put on a housing of an electronic device or the like to add a design.

Although, in the above-described embodiment, the present invention is applied to the information input apparatus or the display apparatus as an example of the electronic device, the present invention is not limited thereto, and can be applied to a variety of electronic devices including a display device, a wiring element (for example, a print substrate) and the like.

In addition to the above-described embodiments, it can be applied to a formation of a membrane switch, a key pad, a solar cell, wiring of a medical device and/or an electrode as well as a formation of a color filter of an image sensor. Also, the wiring, the electrode, the device etc. can be sealed with a resin, which can be applied to a wearable electronics.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

DESCRIPTION OF SYMBOLS 1 wiring substrate
3 substrate
3A substrate layer
3B shaping layer
5 structure
10 pattern layer
13 composition for forming pattern layer
R1 first area
R2 second area
201 liquid crystal display
301 touch panel (information input apparatus)
302D display apparatus
601 display device
610 black layer

The invention claimed is:

1. A pattern substrate, comprising:
   a substrate that has a first surface and an opposite second surface on which a first area and a second area are provided,
   wherein the first surface of the substrate contains a liquid repellant film;
   a pattern layer at the first area among the first area and the second area on the first surface,
   wherein the pattern layer is a wiring pattern layer or a transparent electrode, and
   the first area has a convex/concave shape, and the convex/concave shape is configured by an aggregate of a plurality of structures; and
   another pattern layer formed at the first area among the first area and the second area on the second surface of the substrate,
   wherein a through hole is provided in the first area of the substrate, and a composition of the pattern layer is present in the through hole to connect the first area of the first surface and the first area of the second surface.

2. The pattern substrate according to claim 1, wherein a contact angle is 120 degrees or more if the composition of the pattern layer is dropped onto the first area.

3. The pattern substrate according to claim 1,
wherein an arrangement pitch of the plurality of structures is 150 nm or more to 1 μm or less, and wherein an aspect ratio of the plurality of structures is 1.0 or more to 3.0 or less.

4. The pattern substrate according to claim 1, wherein if the composition of the pattern layer coats the first surface of the substrate, the composition of the pattern layer is continuously left on the first area.

5. The pattern substrate according to claim 1, wherein the second area has liquid repellency to the composition the pattern layer.

6. The pattern substrate according to claim 1, wherein the pattern layer includes a conductive material.

7. The pattern substrate according to claim 6, wherein the conductive material is a transparent oxide semiconductor, a metal or a conductive polymer.

8. The pattern substrate according to claim 1, wherein the pattern layer has a shape similar to the convex/concave shape.

9. An information input apparatus, comprising the pattern substrate according to claim 1.

10. A display apparatus, comprising the pattern substrate according to claim 1.

11. The pattern substrate according to claim 1, wherein the composition of the pattern layer is coated on the first surface of the substrate to provide the pattern layer, and the composition of the pattern layer is continuously left at the first area among the first area and the second area.

12. The pattern substrate according to claim 1, wherein the liquid repellant film contains a compound that has a fluoro alkyl group.

13. The pattern substrate according to claim 1, wherein the second area has a higher liquid repellency to the composition of the pattern layer than the first area.

14. The pattern substrate according to claim 1, wherein the substrate comprises a substrate layer laminated with a shaping layer that has the convex/concave shape, wherein the liquid repellant film is on a surface of the shaping layer.

* * * * *